US012812855B2

(12) United States Patent
Hsu

(10) Patent No.: US 12,812,855 B2
(45) Date of Patent: Nov. 24, 2026

(54) THREE DIMENSIONAL DOUBLE-DENSITY MEMORY ARRAY

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

(*) Notice: Subject to any disclaimer, the term of this patent is extended or adjusted under 35 U.S.C. 154(b) by 575 days.

(21) Appl. No.: 17/209,109

(22) Filed: Mar. 22, 2021

(65) Prior Publication Data

US 2021/0296360 A1 Sep. 23, 2021

Related U.S. Application Data

(60) Provisional application No. 62/992,985, filed on Mar. 21, 2020.

(51) Int. Cl.
*H10B 43/27* (2023.01)
*G11C 11/16* (2006.01)
(Continued)

(52) U.S. Cl.
CPC .......... *H10B 43/27* (2023.02); *G11C 11/1673* (2013.01); *G11C 11/1675* (2013.01);
(Continued)

(58) Field of Classification Search
CPC ........ H10B 43/27; H10B 20/20; H10B 51/20; H10B 61/22; H10B 63/34; H10B 63/845; H10B 51/10; H10B 43/10; G11C 11/1673; G11C 11/1675; G11C 11/2273; G11C 11/2275; G11C 13/004; G11C 13/0069;
(Continued)

(56) References Cited

U.S. PATENT DOCUMENTS 9,818,801 B1 * 11/2017 Rabkin .................. H10B 43/27
2009/0168534 A1 7/2009 Park et al.
(Continued)

FOREIGN PATENT DOCUMENTS

CN 107430875 A 12/2017
CN 110047545 A 7/2019

OTHER PUBLICATIONS

International Search Report, dated Jun. 8, 2021, for corresponding International Application No. PCT/US2021/023535, pp. 1-2.
(Continued)

*Primary Examiner* — Jerome Leboeuf
(74) *Attorney, Agent, or Firm* — INTELLECTUAL PROPERTY LAW GROUP LLP

(57) ABSTRACT

A three dimensional double-density memory array is disclosed. In an embodiment, a three-dimensional (3D) double density array comprises a string of memory devices that are configured so that a first portion of the memory devices form a first channel and a second portion of the memory devices form a second channel. The array also comprises multiple word lines coupled to the string of memory devices. Each word line is coupled to a memory device that forms the first channel and a memory device that forms the second channel. The array also comprises at least one drain select gate that couples the first and second channels to a bit line.

21 Claims, 26 Drawing Sheets

(51) Int. Cl.

| | |
|---|---|
| ***G11C 11/22*** | (2006.01) |
| ***G11C 13/00*** | (2006.01) |
| ***G11C 16/10*** | (2006.01) |
| ***G11C 16/26*** | (2006.01) |
| ***G11C 17/18*** | (2006.01) |
| ***H10B 51/20*** | (2023.01) |
| ***H10B 61/00*** | (2023.01) |
| ***H10B 63/00*** | (2023.01) |
| *H10B 20/25* | (2023.01) |

(52) U.S. Cl.
CPC ...... *G11C 11/2273* (2013.01); *G11C 11/2275* (2013.01); *G11C 13/004* (2013.01); *G11C 13/0069* (2013.01); *G11C 16/10* (2013.01); *G11C 16/26* (2013.01); *G11C 17/18* (2013.01); *H10B 51/20* (2023.02); *H10B 61/22* (2023.02); *H10B 63/34* (2023.02); *H10B 63/845* (2023.02); *G11C 2213/71* (2013.01); *G11C 2213/75* (2013.01); *H10B 20/25* (2023.02)

(58) Field of Classification Search
CPC ......... G11C 16/10; G11C 16/26; G11C 17/18; G11C 2213/71; G11C 2213/75; G11C 11/1655; G11C 11/1657; G11C 11/2255; G11C 11/2257; G11C 13/0002; G11C 2213/72; G11C 2213/77; G11C 13/0023; G11C 13/0026; G11C 13/0028; G11C 13/003; G11C 16/0483; G11C 16/24; G11C 16/08; H10N 70/231; H10N 70/24; H10N 70/823; H10N 70/8833
See application file for complete search history.

(56) References Cited

U.S. PATENT DOCUMENTS

| | | | | |
|---|---|---|---|---|
| 2014/0246643 | A1 | 9/2014 | Kim et al. | |
| 2014/0269082 | A1 | 9/2014 | Mokhlesi et al. | |
| 2016/0071591 | A1 * | 3/2016 | Hsu .................... | G11C 16/0483 438/239 |
| 2016/0071599 | A1 | 3/2016 | Hsu | |
| 2016/0307913 | A1 | 10/2016 | Jiang | |
| 2016/0315097 | A1 | 10/2016 | Hsu | |
| 2017/0062456 | A1 | 3/2017 | Sugino et al. | |
| 2017/0148851 | A1 | 5/2017 | Hsu | |
| 2018/0069017 | A1 | 3/2018 | Barbato | |
| 2019/0287599 | A1 | 9/2019 | Higashi et al. | |
| 2019/0333581 | A1 | 10/2019 | Diep et al. | |
| 2020/0098774 | A1 * | 3/2020 | Yeh ........................ | H10B 43/10 |

OTHER PUBLICATIONS

Written Opinion of the International Searching Authority, dated Jun. 8, 2021, for corresponding International Application No. PCT/US2021/023535, pp. 1-6.
European Search Report, dated Mar. 28, 2024, for counterpart European Application No. 21774592.6 (8 pages).
China Office Action issued by CNIPA, dated Jul. 7, 2026 for corresponding China Application No. 2021800337032 with English translation (total 18 pages).

* cited by examiner

PROGRAM

READ

THREE DIMENSIONAL DOUBLE-DENSITY MEMORY ARRAY

CROSS-REFERENCE TO RELATED APPLICATIONS

This application claims the benefit under 35 U.S.C. § 119 of U.S. Provisional Patent Application No. 62/992,985 filed on Mar. 21, 2020 and entitled "3D MEMORY ARRAY STRUCTURE," which is incorporated by reference herein in its entirety.

FIELD OF THE INVENTION

The exemplary embodiments of the present invention relate generally to the field of semiconductors and integrated circuits, and more specifically to the design, construction, and operation of three dimensional double-density arrays.

BACKGROUND OF THE INVENTION

A conventional double-density three dimensional (3D) array includes pairs of vertical strings and each string is connected to its own set of word lines. Typically, even word lines are connected to one vertical string, and odd word line are connected to the another vertical string. However, having many word line connections results is several disadvantages. For example, there is high word line resistance, and the large number of word lines requires more decoders. Furthermore, during manufacture, conventional arrays may have low process yields and result in unstable word line patterns.

Therefore, it is desirable to have a double-density 3D array that is more reliable and provides better performance than conventional arrays.

SUMMARY

In various exemplary embodiments, methods and apparatus for double-density three-dimensional (3D) arrays are disclosed. In an embodiment, the disclosed double-density 3D arrays are suitable for use as NAND flash memory and in many other types of memory technologies, such as resistive random-access memory (RRAM), phase-change memory (PCM), ferroelectric random-access memory (FRAM), magnetoresistive random-access memory (MRAM). In an embodiment, a three-dimensional (3D) double density array comprises strings of memory devices, and each string is configured so that a first portion of the memory devices form a first channel and a second portion of the memory devices form a second channel. The array also comprises one set of word lines that are coupled to devices in both channels. Thus, the array utilizes less word lines than conventional arrays, which results in lower word line resistance and less word line decoders. This also means that during manufacture, higher process yields resulting from stable word line patterns can be achieved.

In an embodiment, a three-dimensional (3D) double density array is provided that comprises a string of memory devices that are configured so that a first portion of the memory devices form a first channel and a second portion of the memory devices form a second channel. The array also comprises a plurality of word lines coupled to the string of memory devices. Each word line is coupled to a memory device that forms the first channel and a memory device that forms the second channel. The array also comprises at least one drain select gate that couples the first and second channels to a bit line In an embodiment, a method for programming data in a 3D double-density array is provided. The array comprises a string of memory devices configured so that a first portion of the memory devices form a first channel and a second portion of the memory devices form a second channel. The method comprises disabling source select gates that couple the first and second channels to a source line, and applying a program voltage to a selected word line that is connected to a first memory device in the first channel and a second memory device in the second channel. The method also comprises applying an inhibit voltage to unselected word lines, wherein each unselected word line is connected to a first unselected memory device in the first channel and a second unselected memory device in the second channel, apply zero volts to a bit line, and coupling the bit line to the first channel or the second channel to program data to the first memory device or the second memory device, respectively.

In an embodiment, a method for reading data stored in a 3D double-density array is provided. The array comprises a string of memory devices configured so that a first portion of the memory devices form a first channel and a second portion of the memory devices form a second channel. The method comprises enabling source select gates that couple the first and second channels to a source line, applying zero volts to the source line, and applying a read voltage to a selected word line that is connected to a first memory device in the first channel and a second memory device in the second channel. The method also comprises applying a pass voltage to unselected word lines, wherein each unselected word line is connected to a first unselected memory device in the first channel and a second unselected memory device in the second channel, coupling a bit line to the first channel or the second channel to read the first memory device or the second memory device, respectively, and sensing current flow through the bit line to read data stored in the first memory device or the second memory device.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In various exemplary embodiment, methods and apparatus are provided for the design, construction, and operation of double-density 3D memory arrays.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1A:
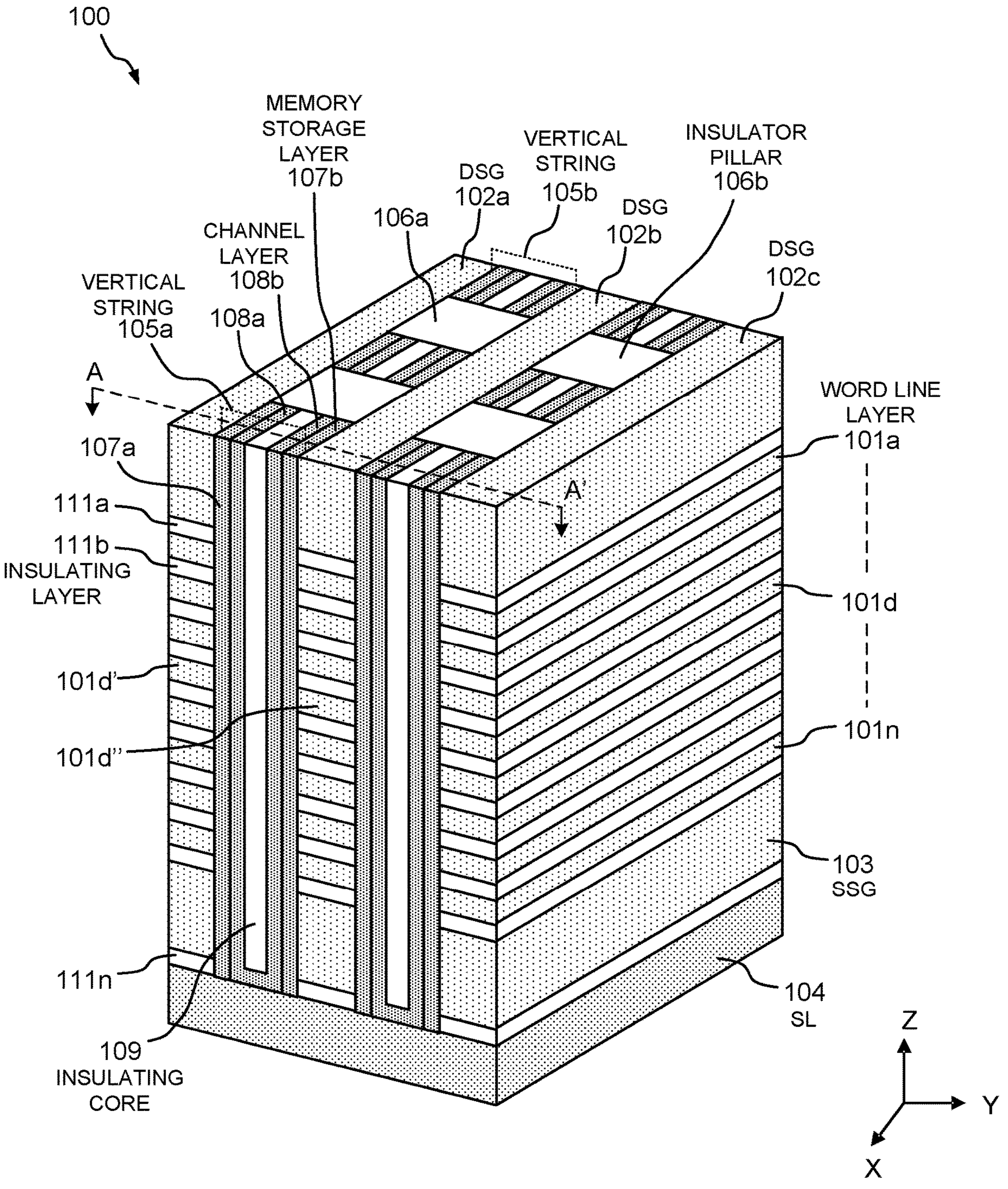
FIG. 1A shows an exemplary embodiment of a double-density 3D NAND flash memory array constructed in accordance with the invention.

FIG. 1A shows an exemplary embodiment of a double-density 3D NAND flash memory array 100 constructed in accordance with the invention. The array 100 comprises multiple word line layers, such as word line layers 101*a-n*. The array 100 also comprises drain-side select gates (DSG) 102*a-c* and source-side select gate (SSG) 103. The array 100 also comprises source line 104 and insulating layers 111*a-n*. It should be noted that the embodiments of arrays disclosed herein can have any number of word line layers 101 (e.g., up to n layers) where n is an integer. However for simplicity and clarity fewer than n layers are actually shown in the drawings.

The array 100 comprises multiple vertical strings, such as strings 105*a* and 105*b*. Each string, such as string 105*a*, includes two memory storage layers 107*a-b* and two channel layers 108*a-b* that are located on two sides of the string. The memory storage layers 107*a-b* are charge-trapping layers formed from suitable material, such as an oxide-nitride-oxide (ONO) material for example. The channel layers 108*a-b* are semiconductor layers formed from suitable material, such as silicon or polysilicon material. The two channel layers 108*a-b* are separated by an insulating core 109. In an embodiment, the strings are isolated by vertical insulator pillars, such as pillars 106*a-b*.

In a conventional double-density 3D array, the word line layers on two sides of a string, such as word line layers 101*d*' and 101*d*", are connected to different word line signals, such as WL(even) and WL(odd), which requires more word lines, more decoders and greater manufacturing complexity. In the 3D array 100, constructed in accordance with the invention, the word lines in the same layer, such as word lines 101*d*, 101*d*', and 101*d*", are connected together, which can be seen in more detail in FIG. 5B. This configuration provides many advantages. Details about the word line connections are provided with reference to FIGS. 5A-D. FIG. 1A demonstrates the structure of the string but does not show the top portion of the array that includes the bit lines. Details about the top portion of the array are provided with reference to FIG. 2A. Cross-section indicator A-A' is also shown in FIG. 1A.

Figure 1B:
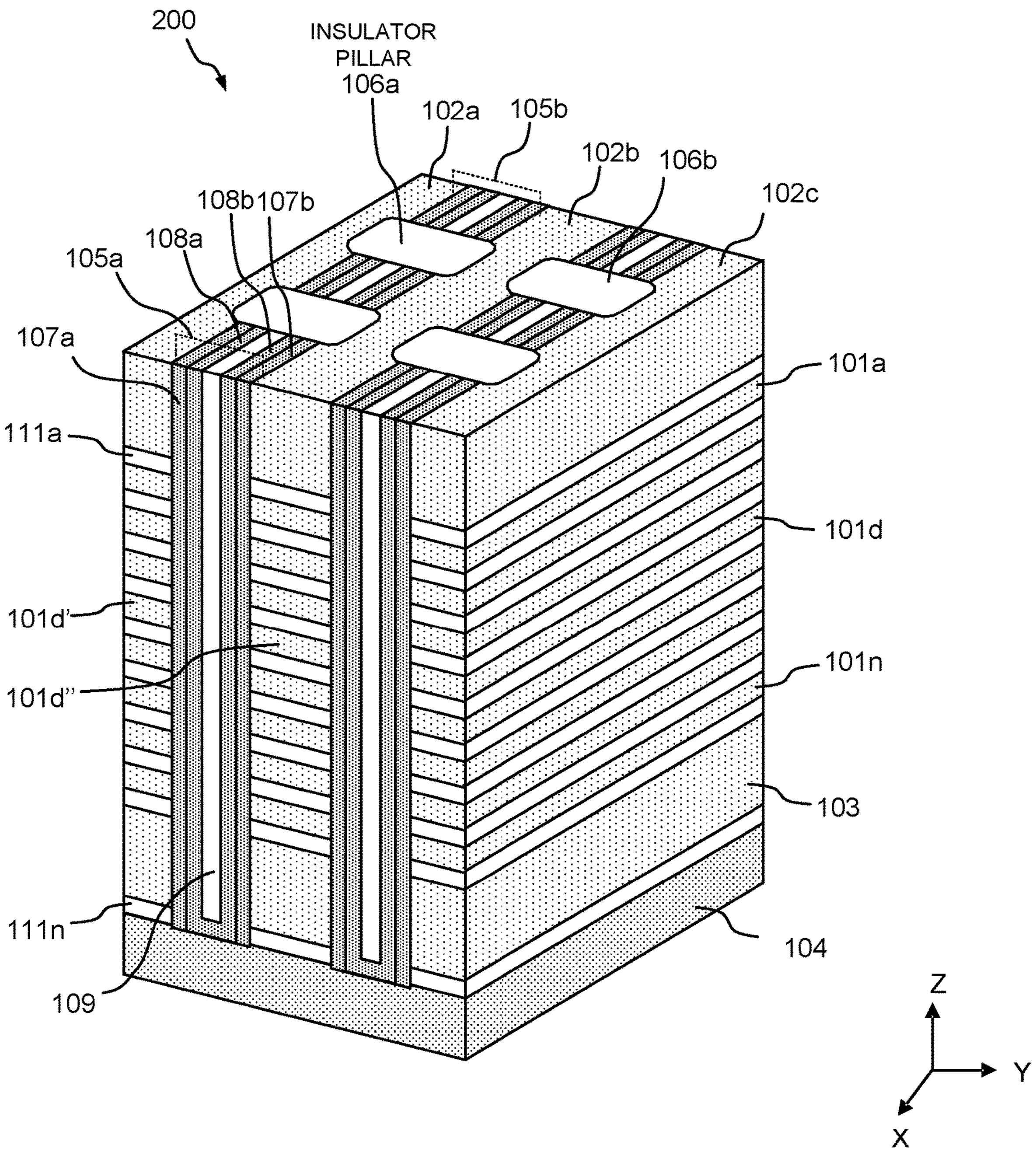
FIG. 1B shows another exemplary embodiment of a double-density 3D array structure according to the invention.

FIG. 1B shows another exemplary embodiment of a double-density 3D array structure 200 according to the invention. This embodiment is similar to the array 100 shown in FIG. 1A except that the pattern and process for the insulator pillars 106*a-b* are different. The insulator pillars 106*a-b* in the array 100 shown in FIG. 1A are formed using a material-selective etching process, such as ion-enhanced or reactive ion etching (RIE). This etching process combines the characteristic of dry etching (physical etching) and wet etching (chemical etching). These etching processes provide good control for both directionality and selectivity. Therefore, they can form the vertical holes through the array to form the pillars 106*a-b* without etching the word line layers 101*a-n*, the drain-side select gates 102*a-c* or the source-side select gate layer 103.

In the array 200 shown in FIG. 1B, the insulator pillars 106*a-b* are formed using a non-material selective etching process, such as dry etching or sputter etching. These etching processes use accelerated ions or plasma and provides good directionality control but low selectivity. Therefore, they may accurately etch through all the layers of the array according to the features defined by the photolithography mask.

Figure 1C:
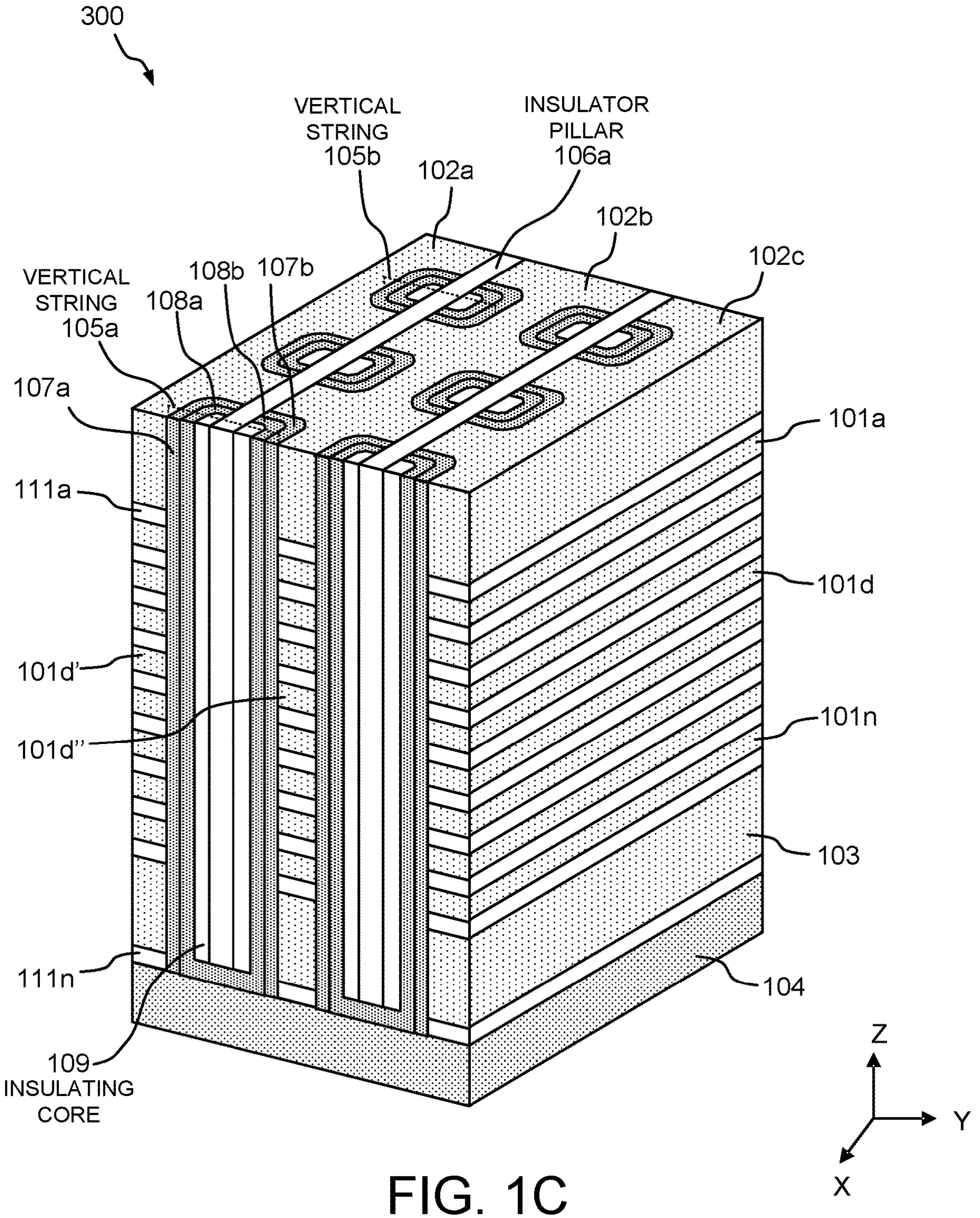
FIG. 1C shows another exemplary embodiment of a double-density 3D array structure constructed in accordance with the invention.

FIG. 1C shows another exemplary embodiment of a double-density 3D array structure 300 constructed in accordance with the invention. This embodiment is similar to the arrays 100 and 200 except that the pattern and process for forming the strings 105*a-b* and the insulator pillars 106*a-b* are different. In this embodiment, after the source-side select gate layer 103, the word line layers 101*a-n*, the drain-side select gates 102*a-c*, and the isolating layers 111*a-h* are deposited, the vertical strings 105*a-b* are formed first, and then the slits 106 are formed to cut each string into two. An anisotropic etching process, such as dry etching or reactive ion etching (RIE) can be used to form the slits 106. After that, an insulator, such as oxide, can be deposited to fill the slit 106 to form the insulator pillar.

Figure 2A:
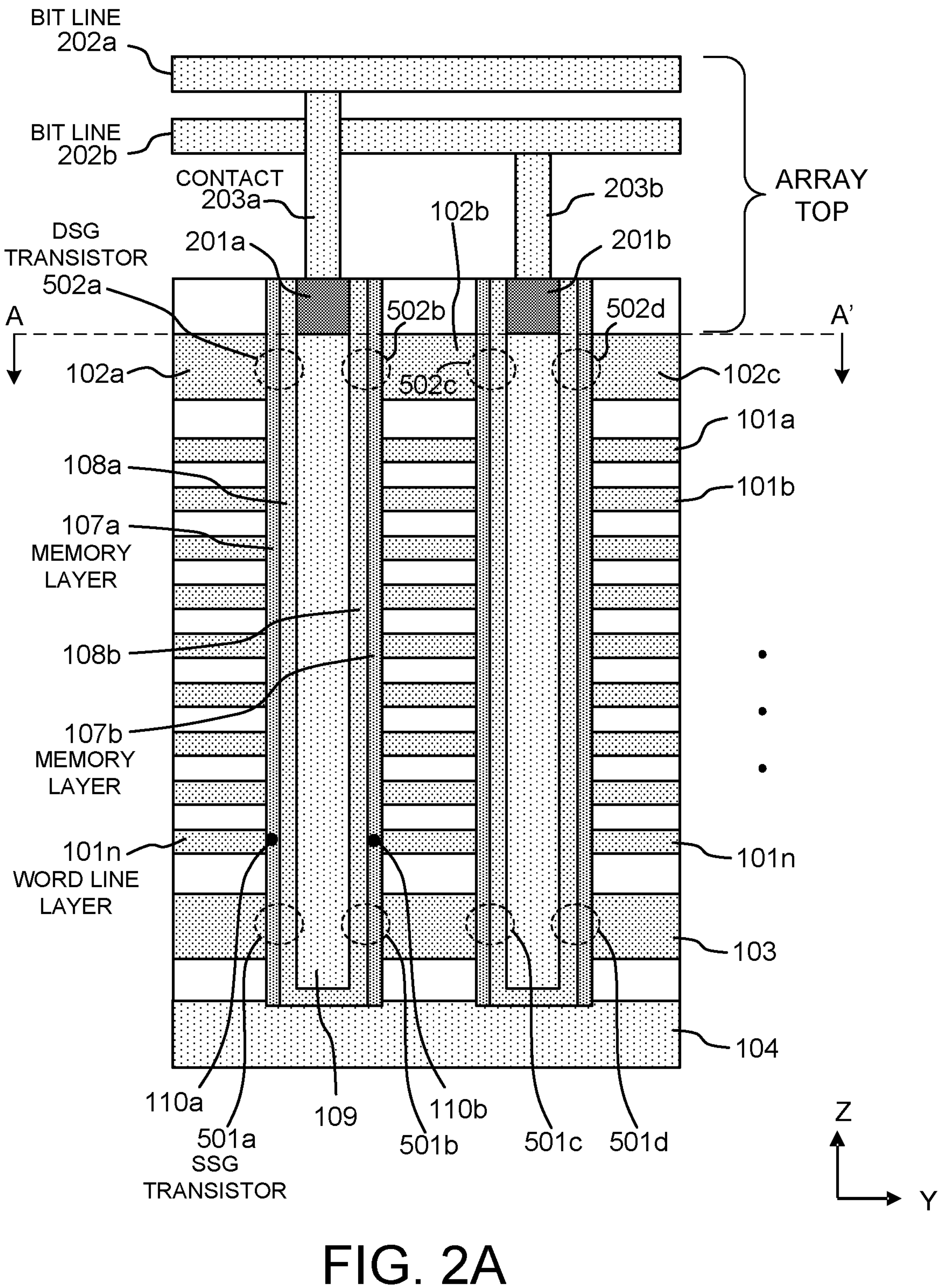
FIG. 2A shows a vertical cross-section of the 3D array shown in FIG. 1A.

FIG. 2A shows a vertical cross-section of the 3D array 100 shown in FIG. 1A. For example, the cross-section is taken along cross-section indicator A-A'. Added to the array 100 is an array top portion having conductor layers 201*a-b* that comprises material, such as polysilicon or metal. The conductor layer 201*a* connects the two vertical channels 108*a* and 108*b* of a string to a bit line 202*a*. The conductor layers 201*a* and 201*b* are connected to different bit lines 202*a* and 202*b* through the contacts 203*a* and 203*b*.

In an embodiment, the drain select gates 102*a-c* are connected to different decoder signals. In an aspect, the intersection of the drain select gates 102*a-c* and the channels of the strings form drain select gate transistors 502*a-d*. In addition, the intersection of the source select gate 103 and the channels of the strings form source select gate transistors 501*a-d*. Therefore, a bit line such as 202*a* may selectively access one of two vertical channels, such as 108*a* or 108*b*, by selecting one of the drain select gates 102*a* or 102*b*, respectively. This allows a selected word line, such as word line 101*n*, to store two different data (e.g., data 110*a* and data 110*b*) in the two memory layers 107*a* and 107*b*. Therefore, the array achieves double-density storage.

Figure 2B:
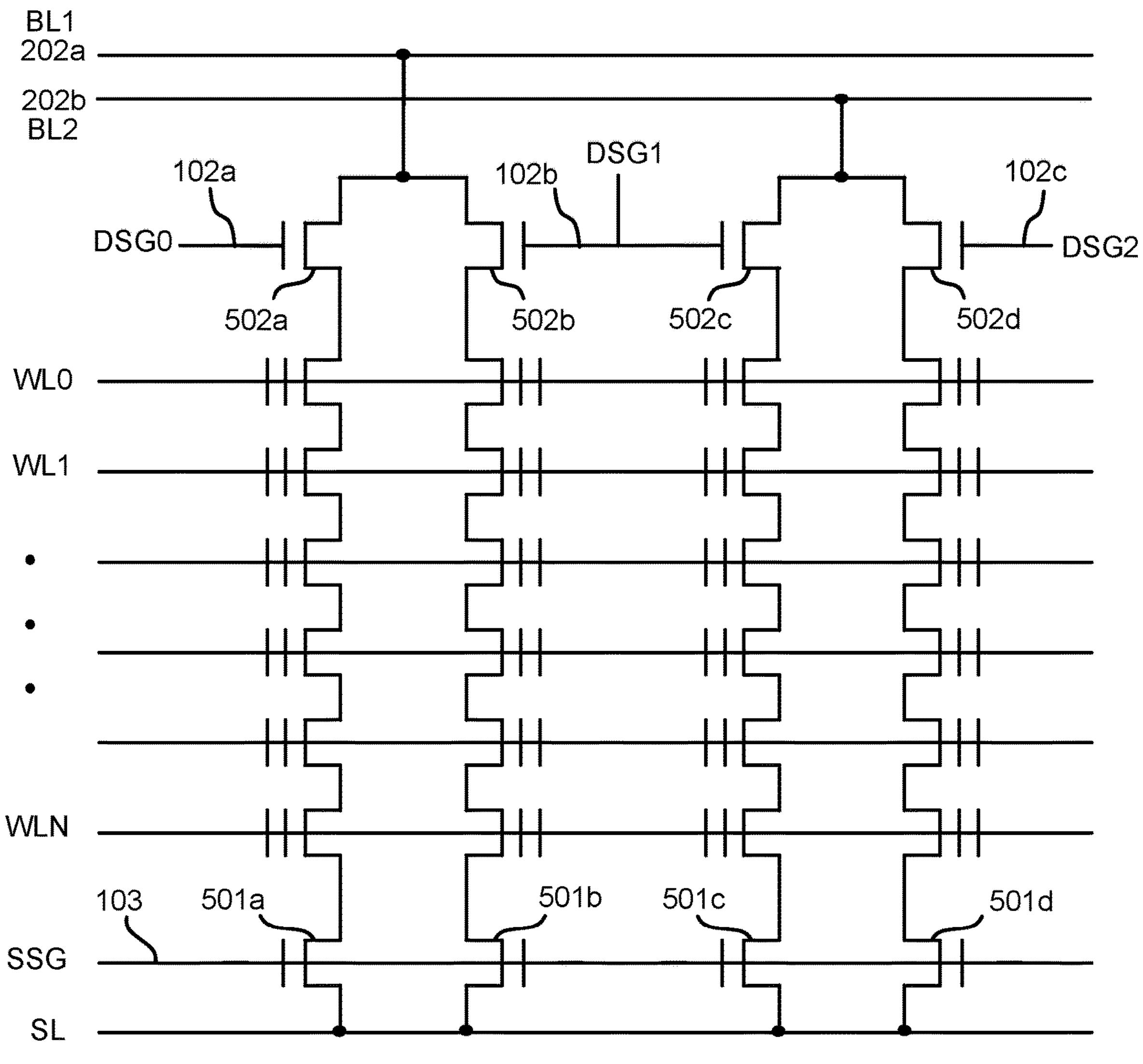
FIG. 2B shows an exemplary embodiment of an equivalent circuit for the 3D array shown in FIG. 2A.

FIG. 2B shows an exemplary embodiment of an equivalent circuit for the 3D array shown in FIG. 2A. In the circuit, the drain select gates 102*a-c* of the drain select gate transistors 502*a-c* are connected to drain select signals DSG0-2, respectively. The word lines layers 101*a-n* are connected to word line signals WL0-N, respectively. The source select gate 103 of the source select gate transistors 501*a-d* is connected to a SSG signal, and the source line 104 is connected to a SL signal.

Figure 3A:
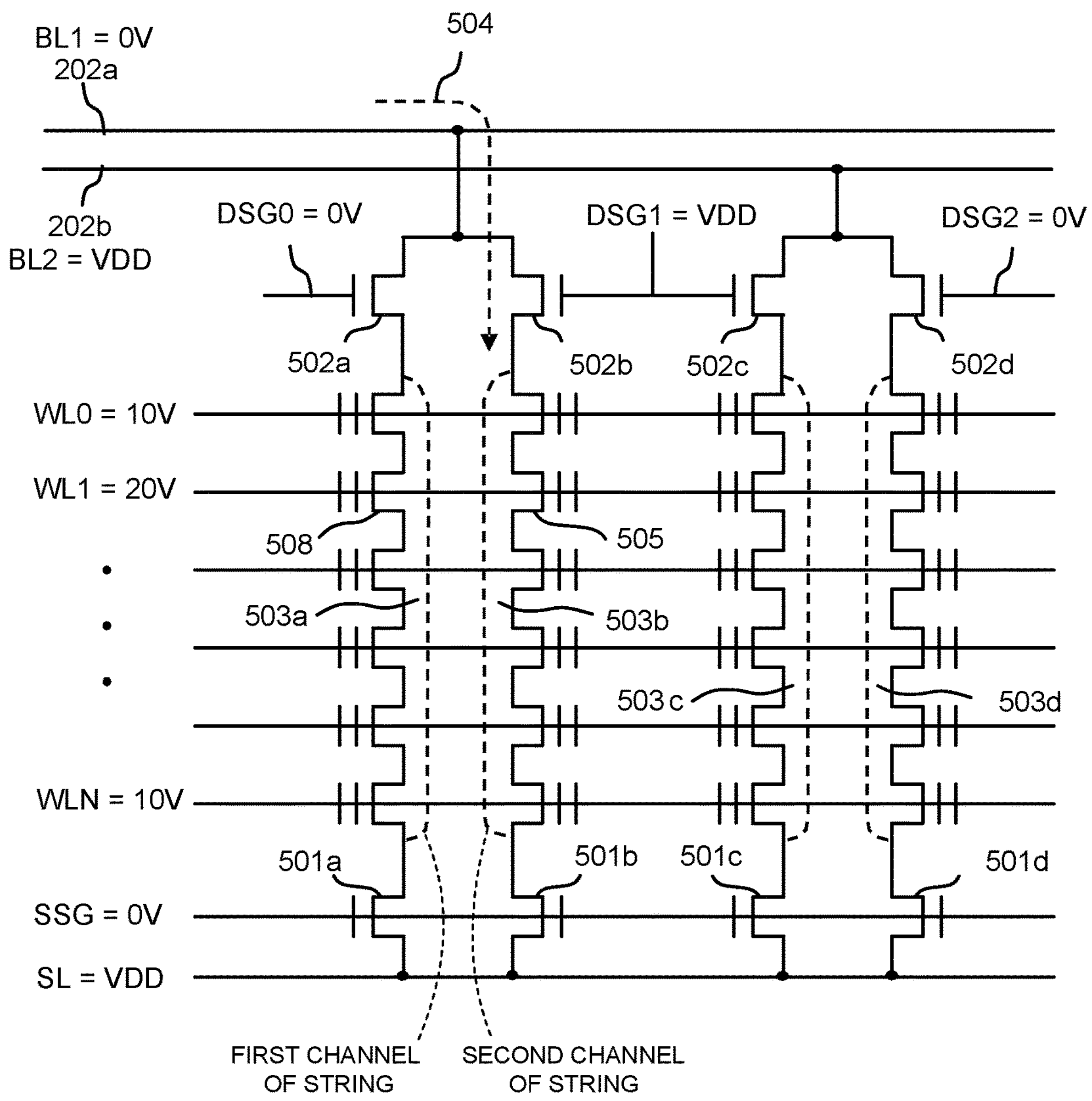
FIG. 3A shows exemplary program conditions for programming the 3D array shown in FIG. 2A.

FIG. 3A shows exemplary program conditions for programming the 3D array shown in FIG. 2A. The source select gate (SSG) is supplied with 0 volts (V) to turn off transistors 501*a-d*. A selected word line (e.g., word line WL1) is supplied with a program high voltage, such as 20V. The unselected word lines (e.g., WL0, WL2-WLN) are supplied with an inhibit voltage, such as 10V. A selected bit line (e.g., BL1) is supplied with 0V. The unselected bit line (e.g., BL2) is supplied with VDD. A selected drain select gate (e.g., DSG1) is supplied with VDD. This will turn on transistor 502*b* and pass 0V from the selected bit line (BL1) to the channel region 503*b* of the selected string, as shown by dashed arrow line 504. Therefore, the selected cell 505 will be programmed by the high electric field of the selected word line WL1.

The unselected drain select gates DSG0 and DSG2 are supplied with 0V. This will turn off the transistors 502*a* and 502*d*. Although the gate of the transistor 502*c* is supplied with VDD, due to the unselected bit line BL2 being supplied with VDD, the transistor 502*c* is turned off. Therefore, channel regions 503*a*, 503*c*, and 503*d* of the unselected strings will be floating and coupled by the word line voltage to a level of about 8V to 10V. This voltage will cancel the electric field of the selected word line WL1, thus the cells on the unselected strings are program-inhibited.

Figure 3B:
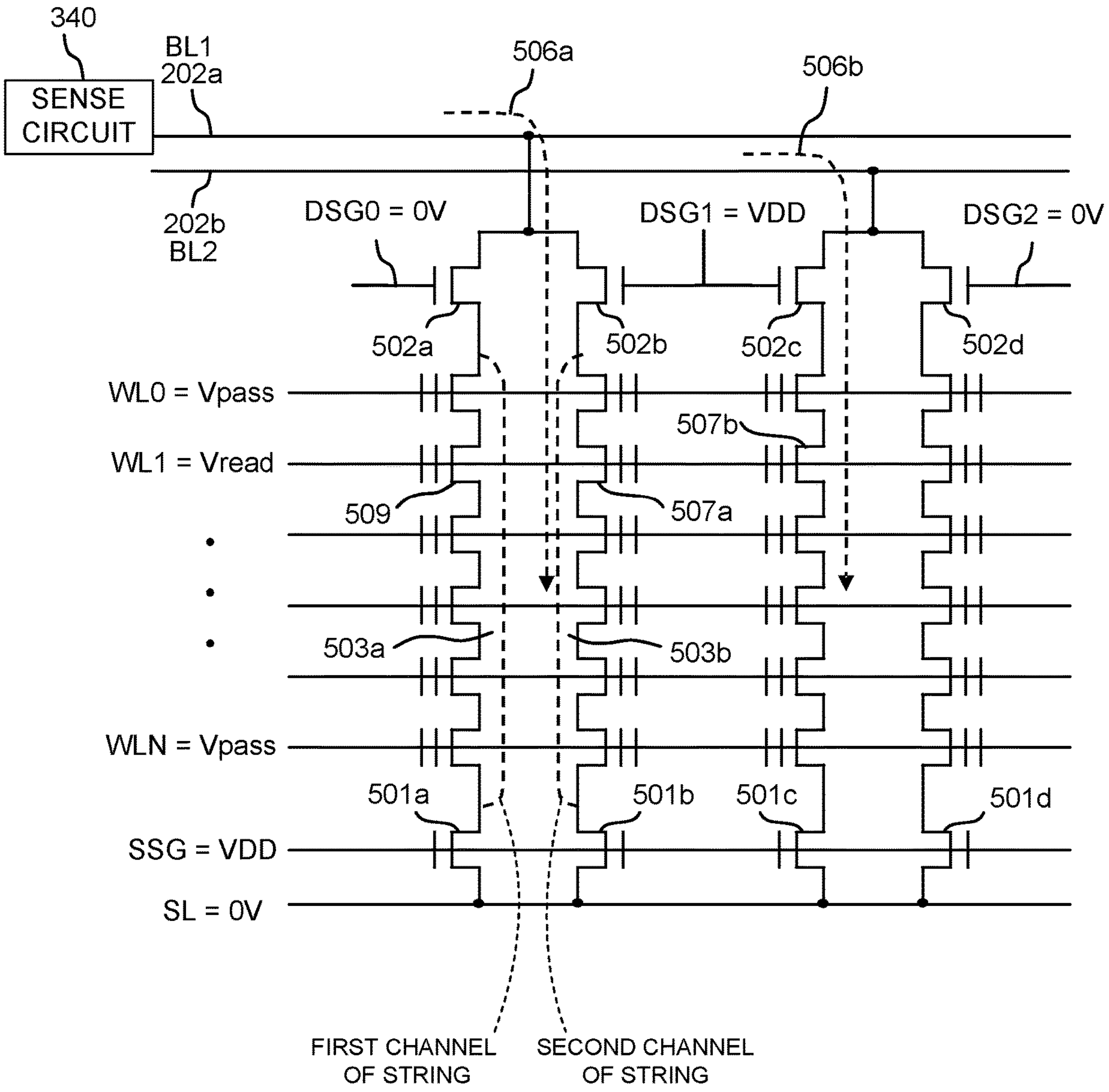
FIG. 3B shows exemplary read conditions for reading the 3D array shown in FIG. 2A.

FIG. 3B shows exemplary read conditions for reading the 3D array shown in FIG. 2A. The source select gate SSG is supplied with VDD to turn on transistors 501*a-d*. The source line SL is supplied with 0V. A selected word line (e.g., WL1) is supplied with a read voltage (Vread). The voltage Vread is a voltage level between an on-cell's and an off-cell's threshold voltage (Vt), thus it will turn on an on-cell and turn off an off-cell. The unselected word lines (e.g., WL0, WL2-WLN) are supplied with a pass voltage (Vpass). The voltage Vpass is higher than an off-cell's threshold voltage (Vt) to turn on the unselected cells.

The selected bit lines BL1 and BL2 are connected to sensing circuits 340. The selected drain select gate DSG1 is supplied with VDD. This will turn on the transistors 502*b* and 502*c*. This will allow the selected cells 507*a* and 507*b* to be read. If the cells 507*a* and 507*b* are on-cells, they will conduct current from the bit lines BL1 and BL2 as shown by arrow lines 506*a* and 506*b*, respectively.

Figure 3C:
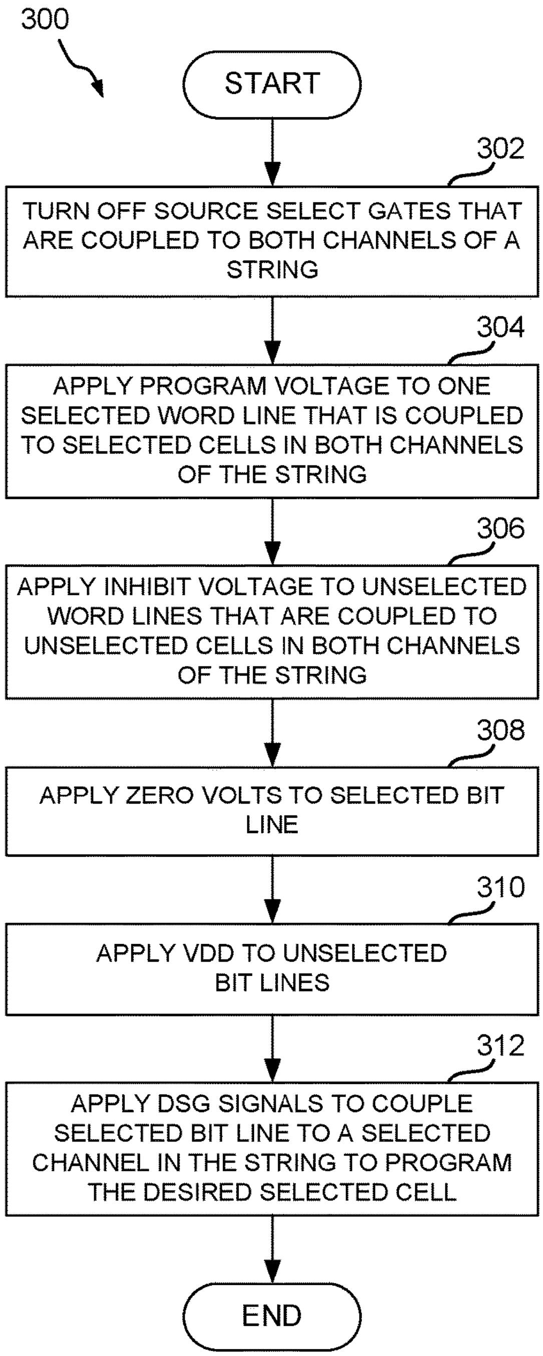
FIG. 3C shows an exemplary method for programming data in the 3D double-density memory array.

FIG. 3C shows an exemplary method 300 for programming data in the 3D double-density memory array. For example, the method 300 is suitable for use to program data in the arrays shown in FIGS. 2A-B and FIG. 3A. In an embodiment, the 3D double-density array comprises a string of memory devices configured so that a first portion of the memory devices form a first channel and a second portion of the memory devices form a second channel. The method comprises the following operations.

At block 302, source select gates that couple the first and second channels to a source line are disabled. For example, the source select gates 501 are disabled.

At block 304, a program voltage is applied to a selected word line that is connected to a first memory device in the first channel and a second memory device in the second channel. For example, as illustrated in FIG. 3A, the program voltage (e.g., 20 volts) is applied to (WL1), which is connected to a first memory device 508 in the first channel of the string and the second memory device 505 in the second channel of the string.

At block 306, an inhibit voltage is applied to unselected word lines, wherein each unselected word line is connected to a first unselected memory device in the first channel and a second unselected memory device in the second channel.

At block 308, zero volts are applied to a bit line. For example, as illustrated in FIG. 3A, zero volts are applied to the BL1 202*a*.

At block 310, VDD is applied to unselected bit lines. For example, as illustrated in FIG. 3A, VDD volts are applied to the BL2 202*b*.

At block 312, the bit line is coupled to the first channel or the second channel to program data to the first memory device or the second memory device, respectively. For example, as illustrated in FIG. 3A, the drain select gate 502*a* is disabled and the drain select gate 502*b* is enabled to couple the bit line BL1 202*a* to the second channel 503*b* of the string. This will cause the memory device 505 to be programmed due to the programming voltage on the word line WL1.

Thus, the method 300 operates to program data in a 3D double-density array. It should be noted that the method is not limited to the operations shown and that the operations can be re-arranged, added to, delete, combined, or otherwise modified within the scope of the embodiments.

Figure 3D:
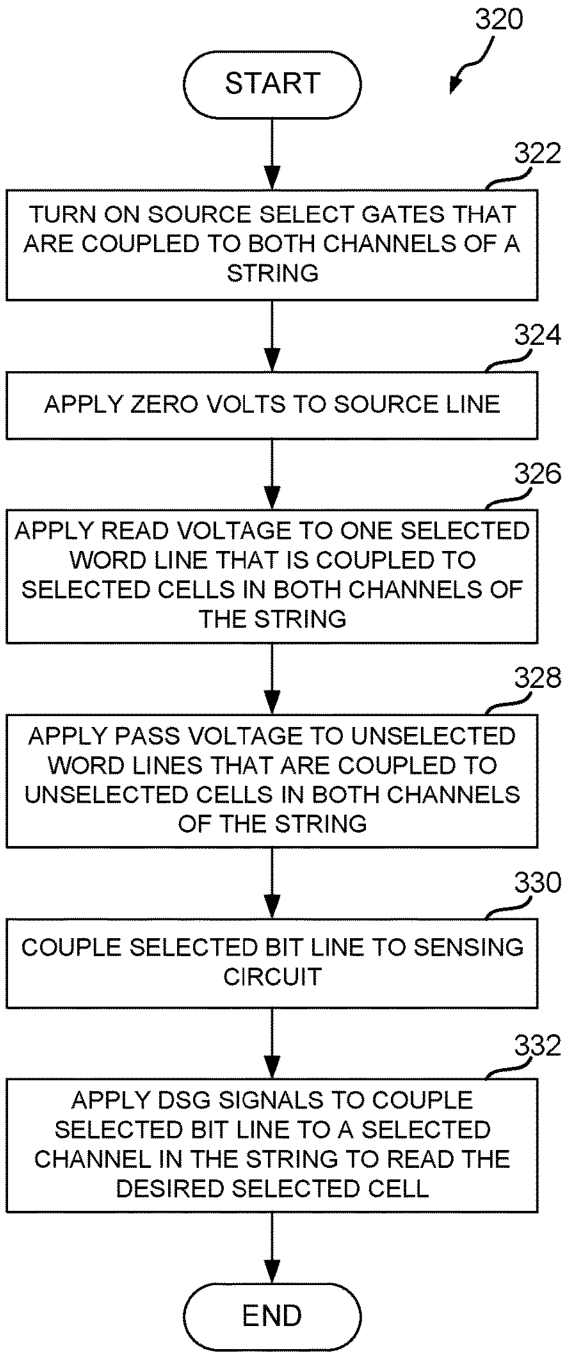
FIG. 3D shows an exemplary method for reading data in the 3D double-density memory array.

FIG. 3D shows an exemplary method 320 for reading data in the 3D double-density memory array. For example, the method 300 is suitable for use to read data in the arrays shown in FIGS. 2A-B and FIG. 3B. In an embodiment, the 3D double-density array comprises a string of memory devices configured so that a first portion of the memory devices form a first channel and a second portion of the memory devices form a second channel. The method comprises the following operations.

At block 322, source select gates that couple the first and second channels to a source line are turned on. For example, the source select gates 501 are enabled.

At block 324, zero volts are applied to a source line. For example, as illustrated in FIG. 3B, 0 volts are applied to the source line (SL).

At block 326, a read voltage is applied to a selected word line that is connected to a first memory device in the first channel and a second memory device in the second channel. For example, as illustrated in FIG. 3B, the read voltage is applied to (WL1), which is connected to a first memory device 509 in the first channel of the string and the second memory device 507*a* in the second channel of the string.

At block 328, a pass voltage is applied to unselected word lines, wherein each unselected word line is connected to a first unselected memory device in the first channel and a second unselected memory device in the second channel.

At block 330, a selected bit line is coupled to a sensing circuit. For example, as illustrated in FIG. 3A, the BL1 202*a* is coupled to a sensing circuit 340.

At block 332, the selected bit line is coupled to the first channel or the second channel to read data to the first memory device or the second memory device, respectively. For example, as illustrated in FIG. 3A, the drain select gate 502*a* is disabled and the drain select gate 502*b* is enabled to couple the bit line BL1 202*a* to the second channel 503*b* of the string. This will cause the memory device 507*a* to be read due to the read voltage on the word line WL1.

Thus, the method 320 operates to read data in a 3D double-density array. It should be noted that the method is not limited to the operations shown and that the operations can be re-arranged, added to, delete, combined, or otherwise modified within the scope of the embodiments.

FIGS. 4A-D show embodiments of bit line connections to configurations of the 3D array shown in FIG. 2A. A horizontal top view of the array is shown.

Figure 4A:
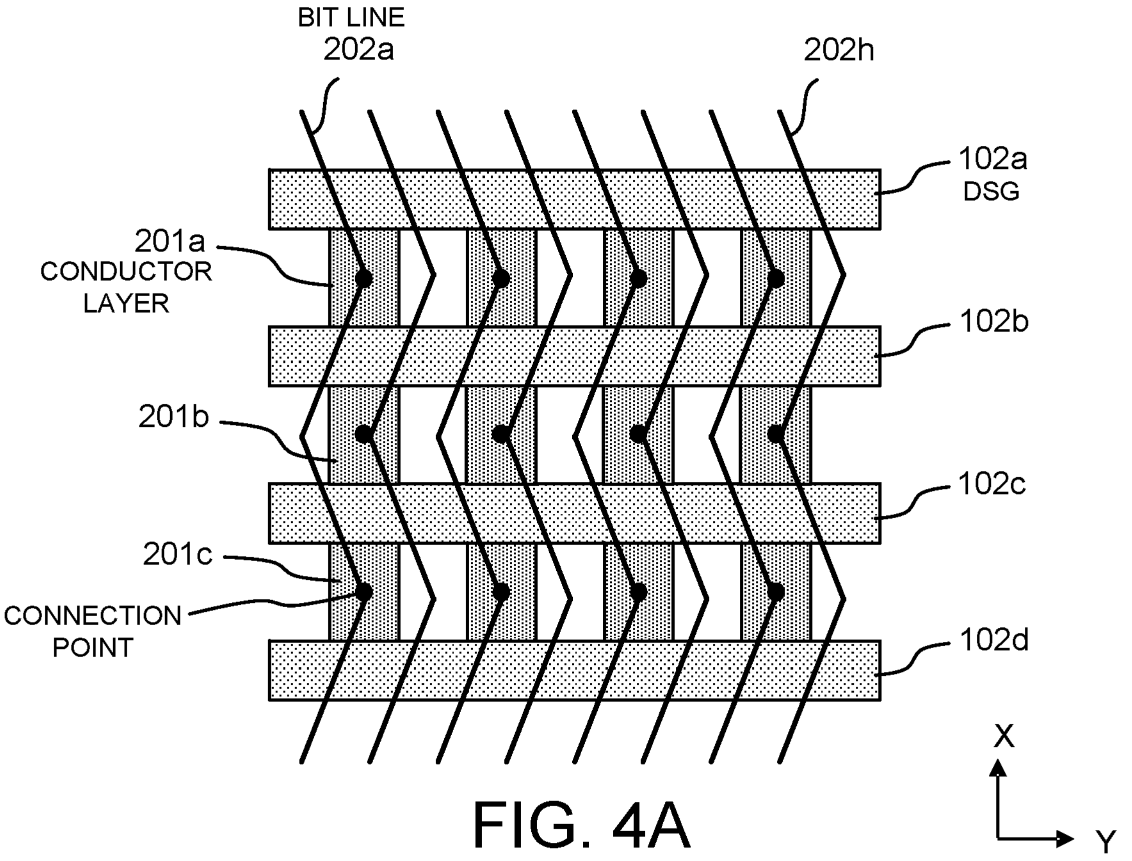
FIGS. 4A-D show embodiments of bit line connections to configurations of the 3D array shown in FIG. 2A.

FIG. 4A shows an embodiment illustrating bit line connections of the 3D array shown in FIG. 2A. In an embodiment, the conductor layers (e.g., 201*a-c*) on top of the vertical strings form straight line patterns. The drain select gates 102*a-d* are also shown. In an embodiment, the bit lines 202*a-h* are connected at connection points to the conductor layers 201 of the vertical strings in a zig-zag pattern as shown.

Figure 4B:
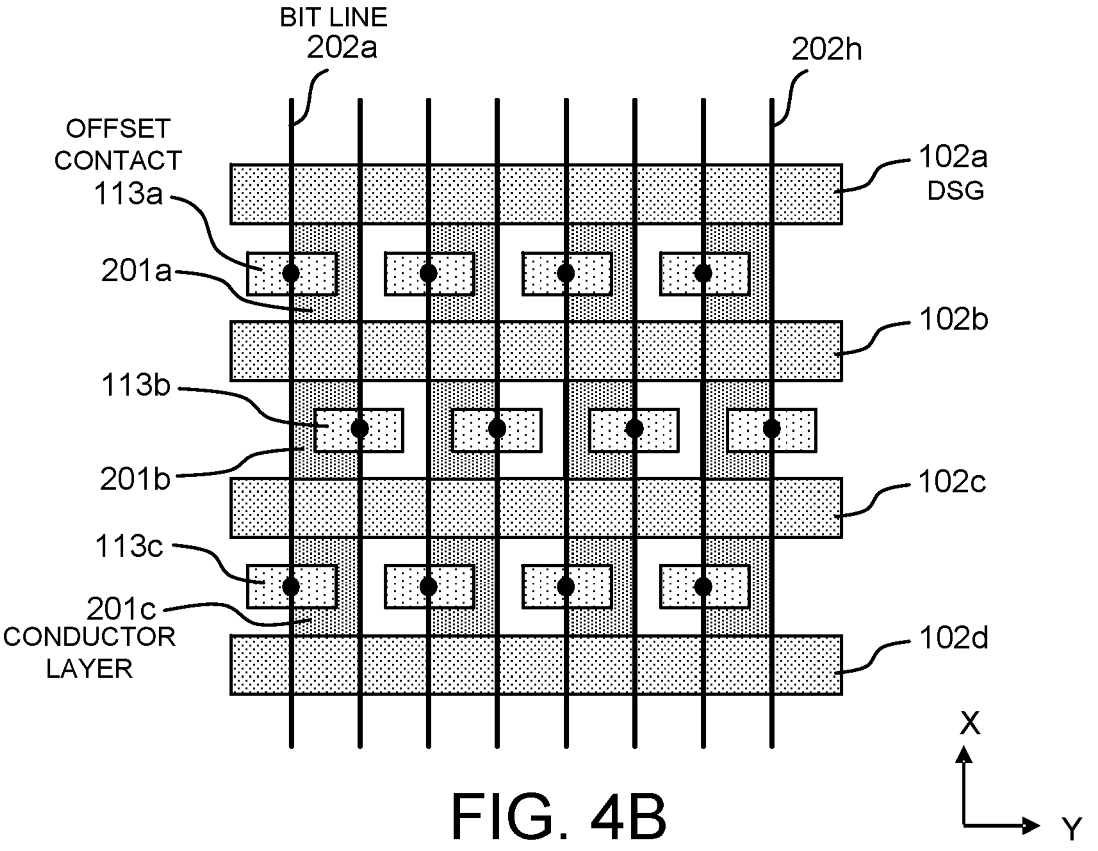

FIG. 4B shows another embodiment of bit line connections of the 3D array shown in FIG. 2A. In this embodiment, offset contacts or conductor layers (e.g., 113*a-c*) are coupled to the conductor layers 201 of the vertical strings. The vertical strings 201 are connected to straight bit lines (202*a-h*) through the offset contacts or conductor layers 113.

Figure 4C:
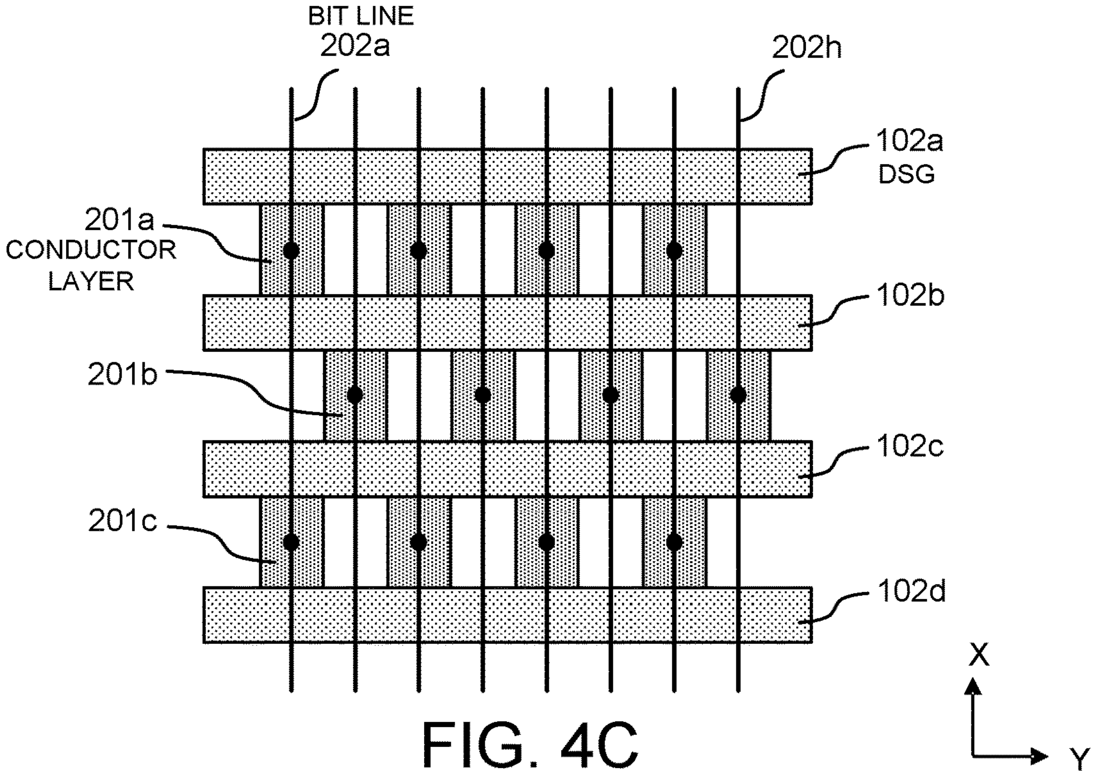

FIG. 4C shows another embodiment of the bit line connections of the 3D array shown in FIG. 2A. In this embodiment, the vertical strings are staggered as illustrated by the conductor layers 201 on top of the vertical strings. This allows straight bit lines 202*a-h* to the vertical strings 201.

Figure 4D:
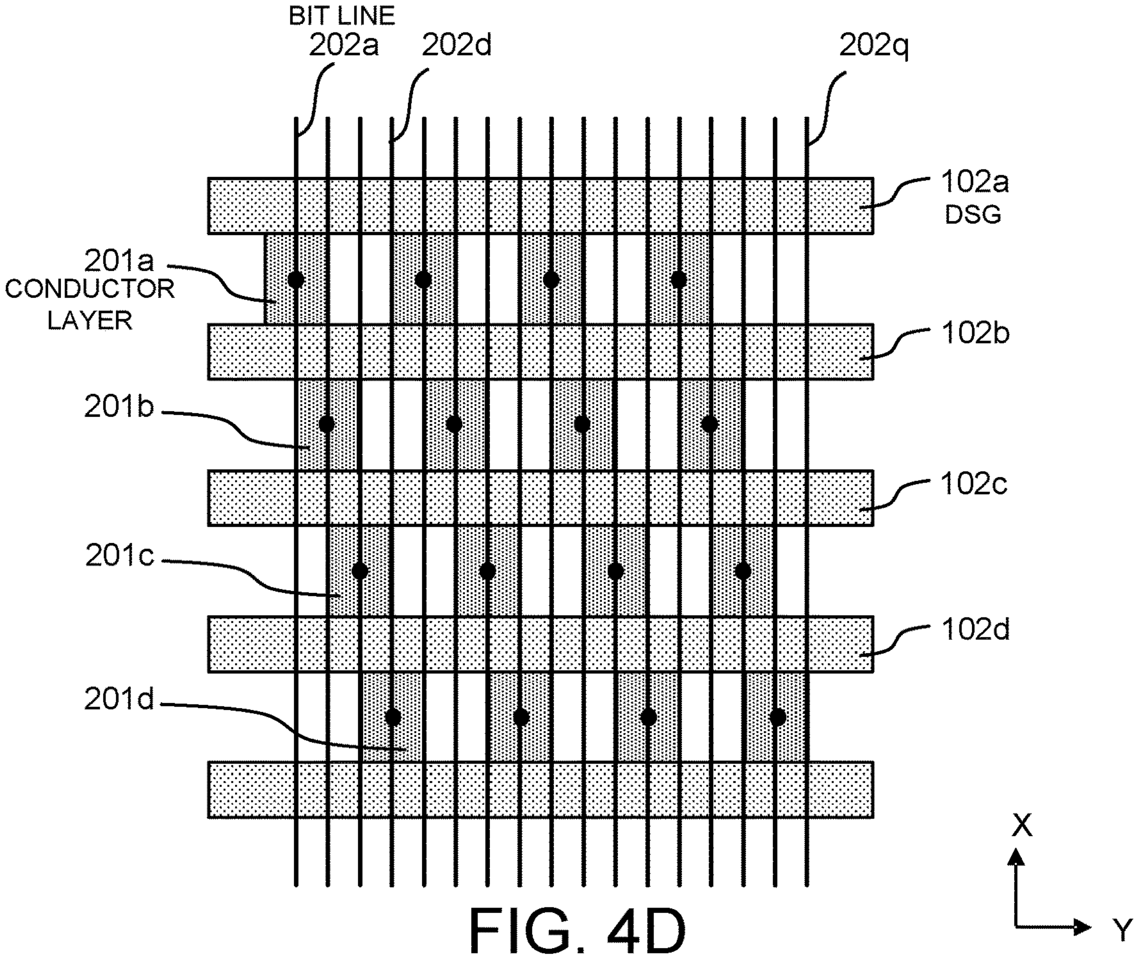

FIG. 4D shows another embodiment of the bit line connection of the 3D array shown in FIG. 2A. In this embodiment, the vertical strings are offset as illustrated by the conductor layers 201 on top of the vertical strings. This allows the conductor layers 201 to connect to different bit lines 202, respectively. This embodiment increases the number of the bit lines that may be read and programmed simultaneously, and therefore increases data throughput.

Figure 5A:
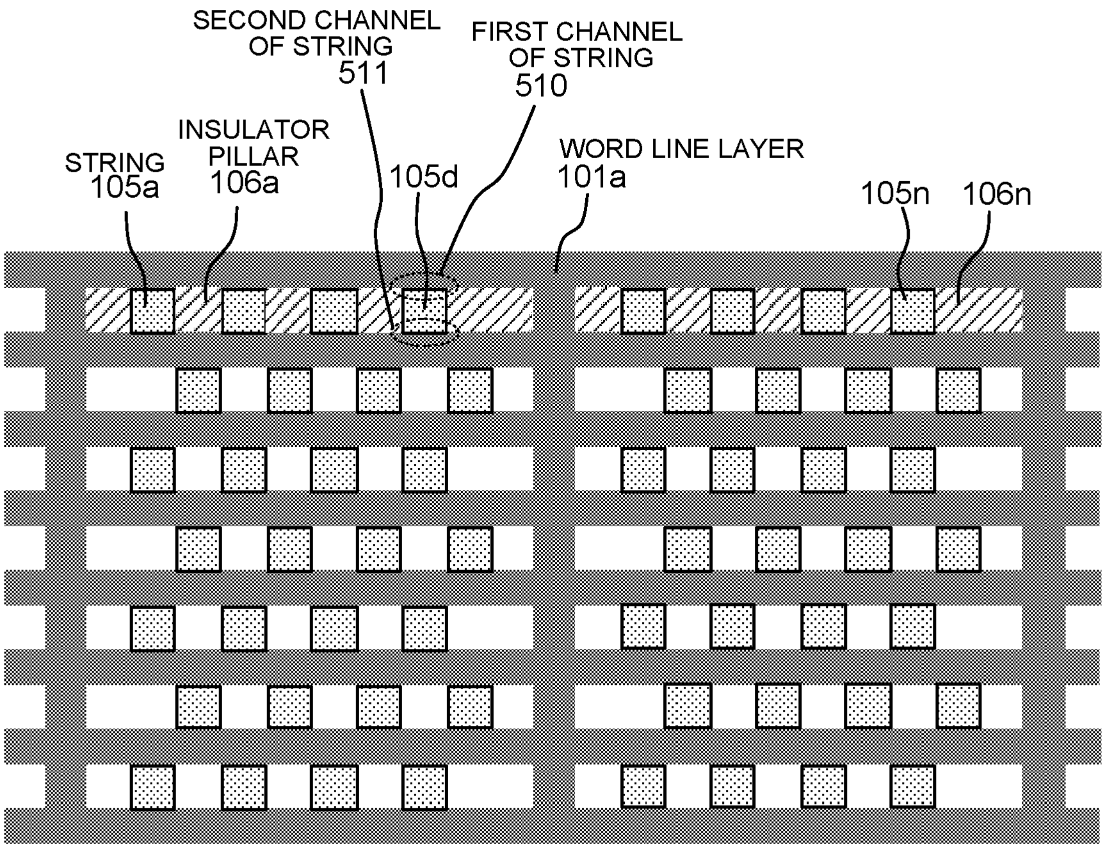
FIG. 5A shows an exemplary top view of a word line layer of a 3D array shown in FIG. 1A.

FIG. 5A shows an exemplary top view of a word line layer of a 3D double-density array constructed in accordance with the invention. This view illustrates the vertical strings (e.g., 105*a-n*) and insulating pillars (e.g., 106*a-n*). In an exemplary embodiment, the word line extends throughout the same layer, as illustrated by word line 101*a*. The word line is connected to both channels of each string. For example, the word line 101*a* connects to both the first channel 510 and the second channel 511 of string 105*d*. This configuration results in fewer word lines than convention arrays, which utilize odd and even word lines in the same layer. Having one word line throughout the layer provides several advantages. First, the word line resistance is significantly reduced. Second, the number of the word line decoders for all the word line layers are reduced by half. Third, the process yield is increased due to the simpler pattern for high-aspect etching. Fourth, the word line pattern is more stable and has less chance to bend or tilt. In summary, the word line configuration in accordance with the invention as shown in FIG. 5A is much more reliable and has superior performance over conventional array configurations having odd and even word lines in the same layer.

Figure 5B:
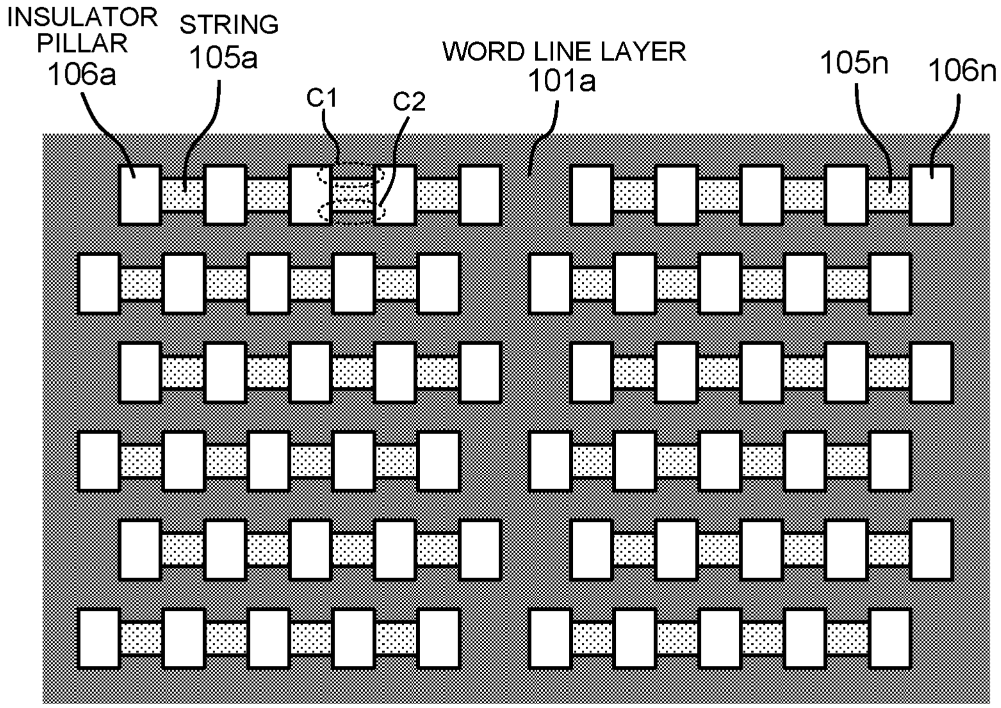
FIG. 5B shows an embodiment of a top view of a word line layer for the 3D array shown in FIG. 1B.

FIG. 5B shows another embodiment of the word line layer connections for the 3D array shown in FIG. 1B where one word line extends throughout the layer and connects to the first and second channels (C1 and C2) of each string.

Figure 5C:
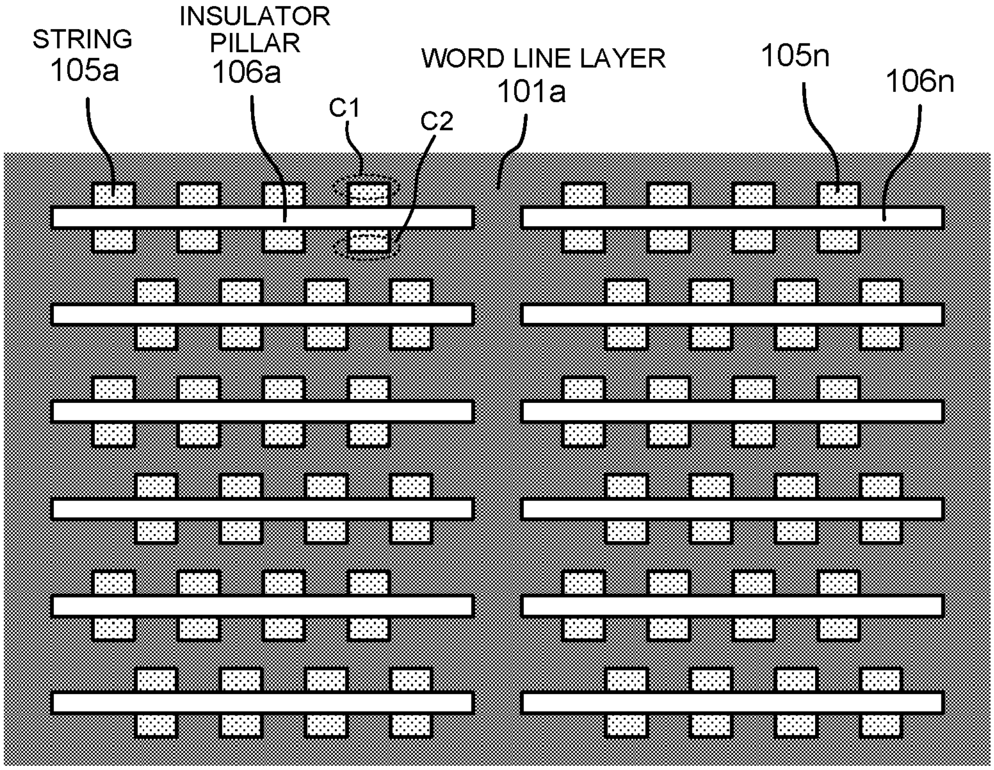
FIG. 5C shows an embodiment of a top view of a word line layer for the 3D array shown in FIG. 1C.

FIG. 5C shows another embodiment of the word line layer connections for the 3D array shown in FIG. 1C where one word line extends throughout the layer and connects to the first and second channels (C1 and C2) of each string.

Figure 6:
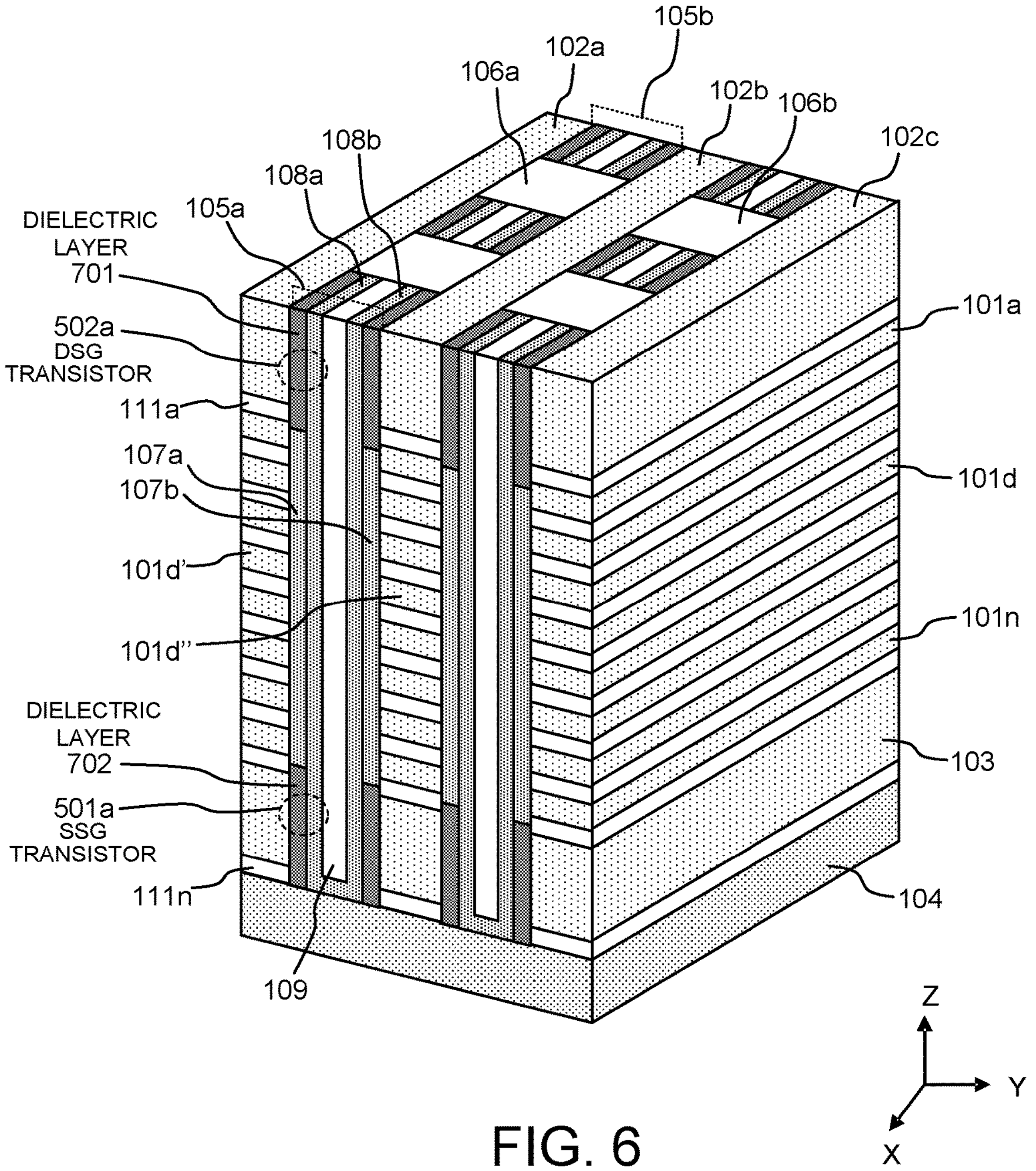
FIG. 6 shows another exemplary embodiment of a 3D array constructed in accordance with the invention.

FIG. 6 shows another exemplary embodiment of a 3D array constructed in accordance with the invention. This embodiment is similar to the array shown in FIG. 1A, except that it includes gate dielectric layers (e.g., 701 and 702) that replace portions of the memory storage layers 107. In an embodiment, the gate dielectric layers are formed from dielectric material, such as an oxide or high-K material. This change results in the drain select gate transistors (e.g., 502*a*) and source select gate transistors (e.g., 501*a*) forming pure MOS transistors, rather than the memory cell transistors used is FIG. 1A. The configuration of this embodiment also can be applied to the 3D arrays shown in FIG. 1B and FIG. 1C.

In another embodiment, the drain select transistors and source select transistors are formed by using vertical transistors with source and drain junctions. In still another embodiment, the memory cells are implemented by using floating-gate (FG) flash memory cells.

In still another embodiment, the array is flipped, thus the bit lines and drain select gate are located in the bottom of the array, and the source line and source select gates are located in the top of the array.

The double-density 3D array structures disclosed herein also can be applied to other type of memory technologies, such as resistive random-access memory (RRAM), phase-change memory (PCM), ferroelectric random-access memory (FRAM), and magnetoresistive random-access memory (MRAM).

Figure 7:
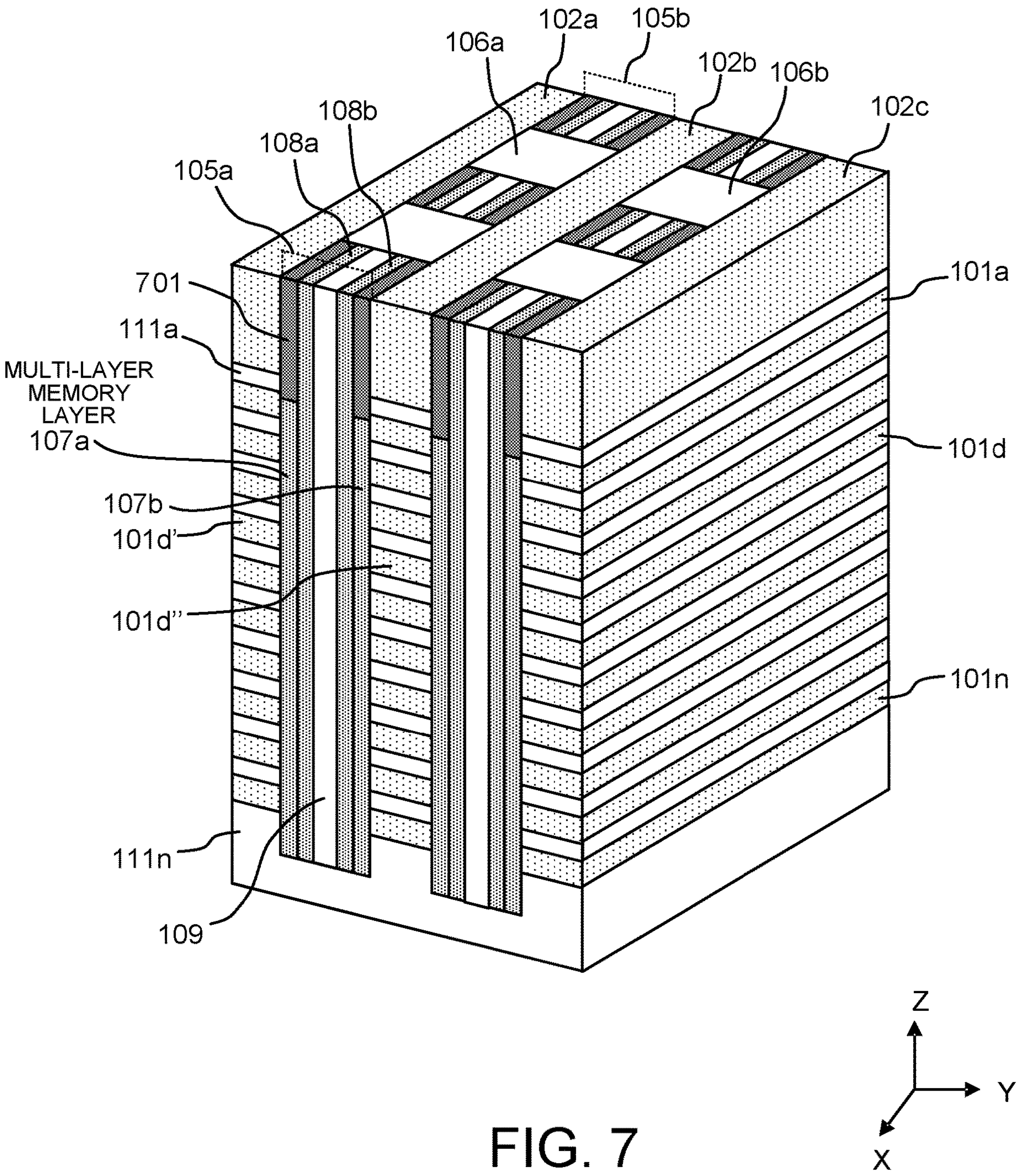
FIG. 7 shows another exemplary embodiment of a 3D array constructed in accordance with the invention.

FIG. 7 shows another exemplary embodiment of a 3D array constructed in accordance with the invention. This array includes memory layers, such as memory layers 107*a-b* for above-mentioned memory cells. In an embodiment, the memory layers comprise a multiple-layer structure that includes a selector layer and a variable resistive memory element. The selector may be a diode, Schottky diode, or any other threshold-behavior material. Conductor layers, such as layers 108*a-b*, comprise material such as silicon, polysilicon, or metal.

Figure 8:
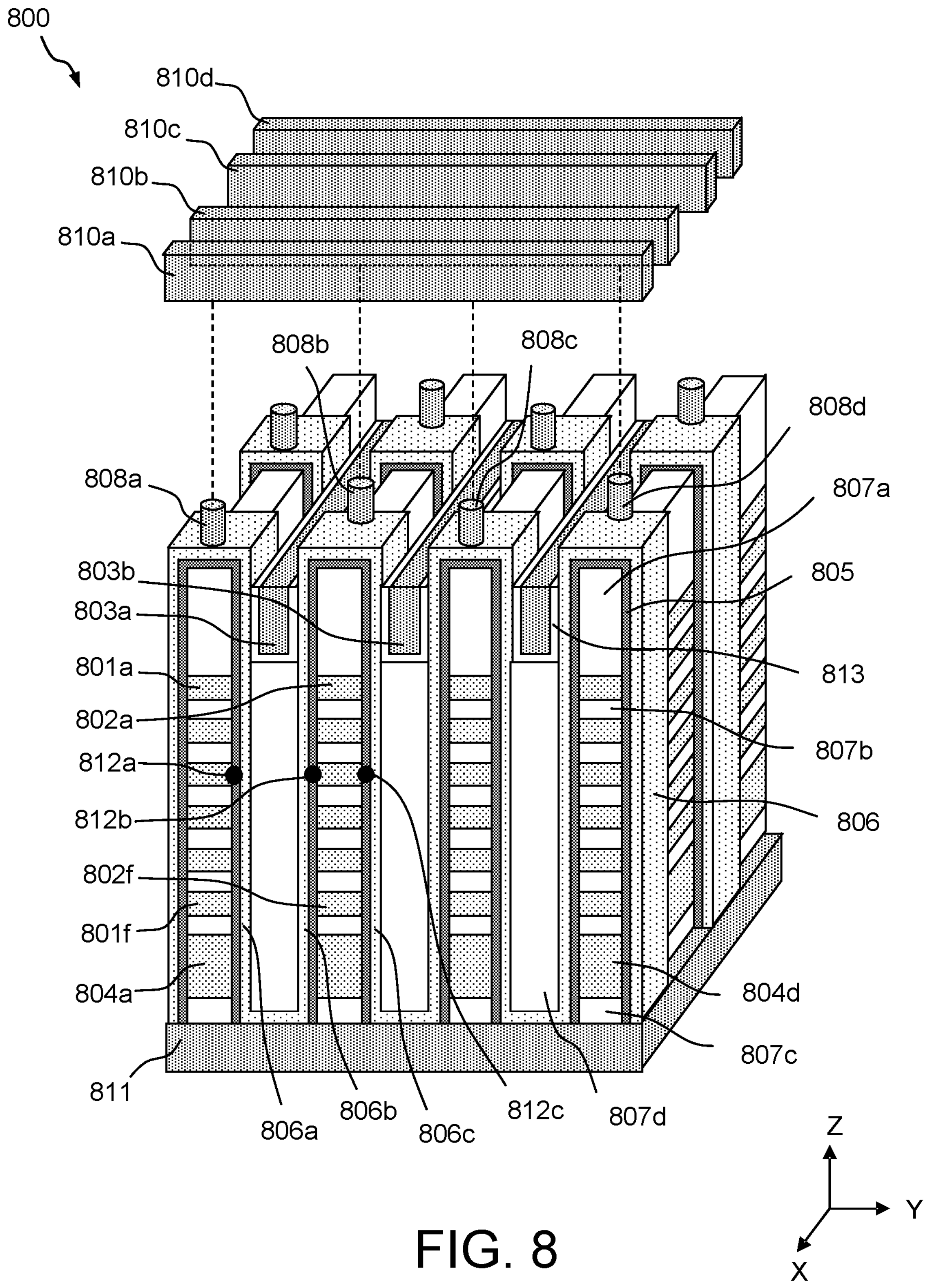
FIG. 8 shows another embodiment of a 3D array constructed in accordance with the invention.

FIG. 8 shows another embodiment of a 3D array 800 constructed in accordance with the invention. This array 800 comprises multiple word line layers, such as 801*a-f* and 802*a-f* that run in the X direction. The word lines layers are formed from conductor material, such as metal or polysilicon. The word line layers are formed as a multiple-layer stack and separated by insulting layers, such as insulating layers 807*a-h*. All the word line layers in even stacks, such as word line layers 801*a-f*, are connected to even word line signals, (e.g., WLe(0-N)), respectively. All the word lines in odd stacks, such as word line layers 802*a-f*, are connected to odd word line signals, (e.g., WLo(0-N)), respectively.

Also included in the array 800 is a memory storage layer 805. Depending on the type of memory and technology, the memory-storage layer 805 can be a charge-trapping layer or floating gates for NAND flash memory, variable resistive layer such as HfOx, TaOx, TiOx, PtOx, WOx, AlOx, CuOx, etc. for RRAM, ferroelectric layer for FRAM, magneto-resistive layers for MRAM, phase-change material such as chalcogenide for PCM, dielectric layer for anti-fuse OTP, or other suitable memory layer.

For charge-trapping type of NAND flash memory application, the memory-storage layer 805 comprises a multiple-layer structure, such as nitride-oxide-nitride (ONO) layers. The nitride layer performs a charge-trapping function that trapes electron charge to represent the stored data.

The array also comprises a semiconductor (or silicon) layer 806, such as silicon or polysilicon. The silicon layer 806 can have N-type or P-type of doping. The silicon layer 806 runs in the Z-direction and is defined as a vertical bit line (BL).

In an embodiment, a junction-less transistor is formed at the intersection of a word line and a vertical bit line, such as indicated by transistors 812*a*, 812*b*, and 812*c*. Each transistor is defined as a 'memory cell'. The word line layers 801*a-f* and 802*a-f* form the gates of the transistors, and the silicon layers 806*a*, 806*b*, 806*c*, etc. form the channel regions of the transistors. Unlike the conventional array where the word line layers 801*a-f* and 802*a-f* are separate and connected to different decoders, the arrays constructed according to the invention, have word lines layers on the same layer, such as 801*a* and 802*a* that are connected together.

During operation, by applying the proper bias conditions, electrons are injected into or removed from the memory storage (or charge-trapping) layer 805 (e.g., 805*a*). This change to the charge-trapping layer changes the threshold voltage (Vt) of the transistor, which represents the data stored in the cell.

The array also comprises source select gates (SSG) 804*a-d* that run in the X-direction. The source select gates are conductors that comprise metal or polysilicon. The source select gates 804*a-d* can be connected together or connected to signals from different decoders. The source select gates select the silicon layers, such as silicon layers 806*a-c*, to be connected to a source line layer 811. The source line layer 811 comprises a conductor, such as metal or polysilicon.

The array also comprises drain select gates (DSG), such as DSG 803*a-b* that are formed of conductor material, such as metal or polysilicon, and run in the X-direction. In an embodiment, a DSG transistor, such as transistor 820*a*, is formed at the intersection of the DSG 803*a* and a corresponding silicon layer (e.g., 806*a*). A gate dielectric layer 813 is provided that comprises oxide or high-K material.

The array also comprises bit line contacts 808*a-d*. The bit line contacts 808*a-d* are alternately connected to horizontal bit lines 810*a* and 810*b*. For example, the even bit line contacts 808*a* and 808*c* are connected to the first bit line 810*a*, and the odd bit line contacts 808*b* and 808*d* are connected to the second bit line 810*b*. The horizontal bit lines 810*a-d* are formed of conductor material, such as metal or polysilicon.

In an embodiment, the drain select gate, such as drain select gate 803*a* is located between the vertical silicon layers 806*a* and 806*b*. When the drain select gate 803*a* is selected, it will connect the vertical silicon layers 806*a* and 806*b* to the contacts 808*a* and 808*b*, respectively, which are also connected to the horizontal bit lines 810*a* and 810*b*, respectively.

Figure 9:
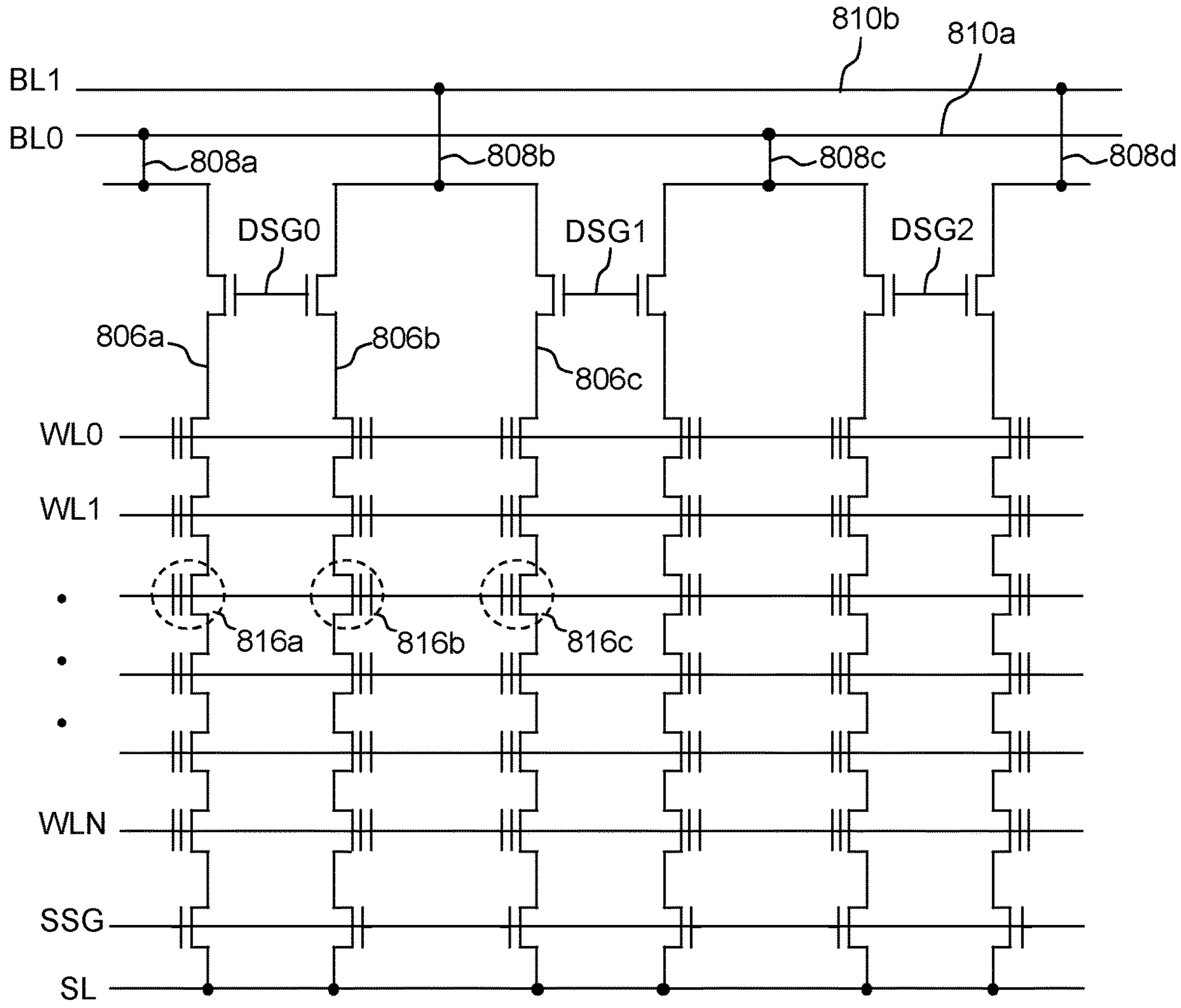
FIG. 9 shows the equivalent circuit of the array embodiment shown in FIG. 8.

FIG. 9 shows an embodiment of an equivalent circuit of the array shown in FIG. 8. In the circuit shown in FIG. 9, the cells 816*a-c* are coupled to the same word line. When the drain select gate signal DSG0 is selected, the cells 816*a* and 816*b* will be coupled to bit lines BL0 810*a* and BL1 810*b*, respectively. This allows the cells 816*a* and 816*b* to be read and programmed independently. For cells 816*b* and 816*c*, these cells will be coupled to the bit line BL0 810*a* by selecting drain select gate signals DSG0 or DSG1, respectively. This allows the cells 816*b* and 816*c* to be read and programmed independently.

It should be noted that the alternating bit line contacts 808*a-d* shown in FIGS. 8-9 could be implemented in many ways, such as illustrated by the various contact implementations shown in FIGS. 4A-D.

Figure 10:
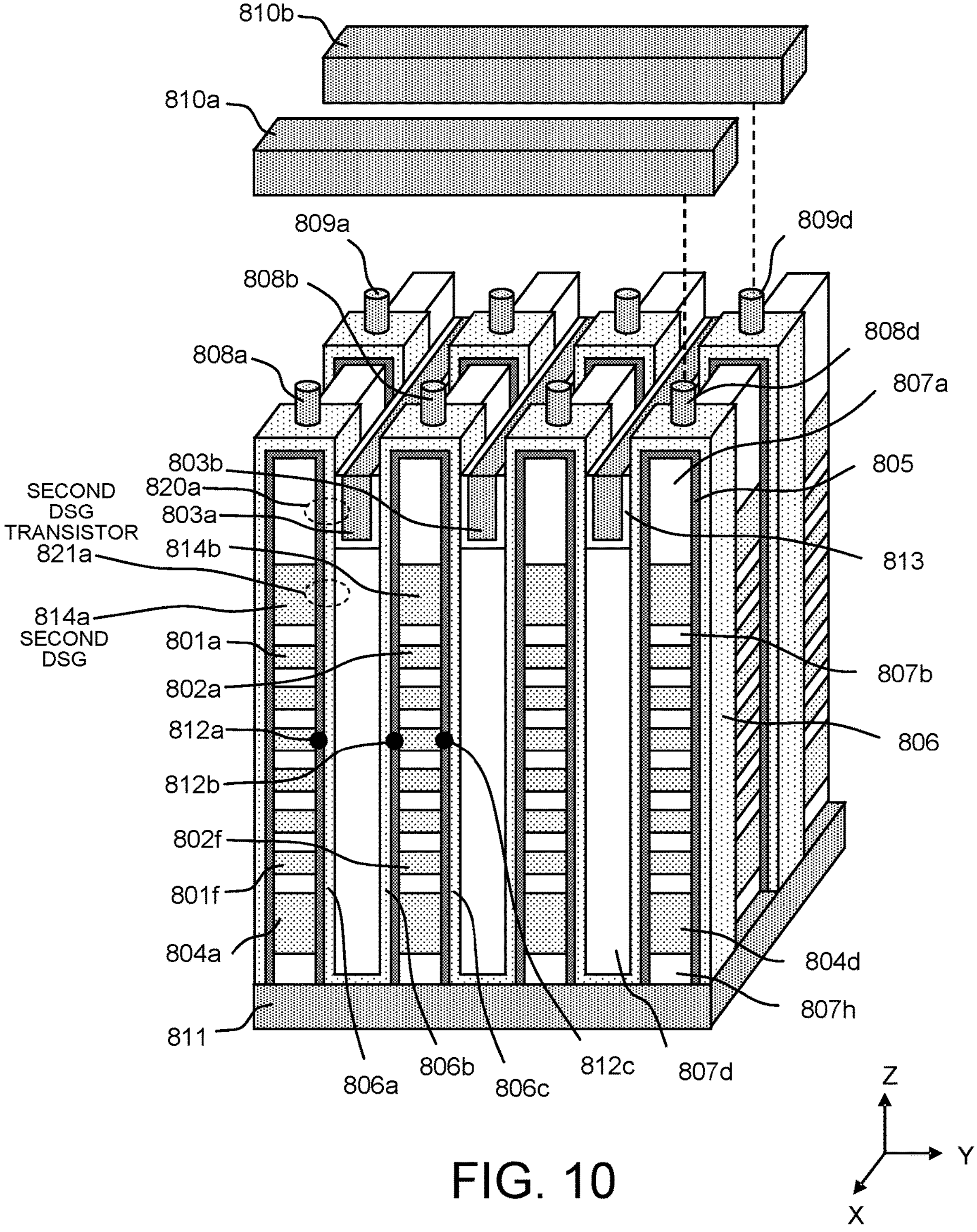
FIG. 10 shows another embodiment of a 3D array structure constructed in accordance with the invention

FIG. 10 shows another embodiment of a 3D array structure constructed in accordance with the invention. This embodiment is similar to the one shown in FIG. 8 except that the array shown in FIG. 10 includes additional second drain select gates, such as 814*a* and 814*b*. The second drain select gates 814*a* and 814*b* run in the X-direction and are formed from conductors, such as metal or polysilicon. In an embodiment, a second DSG transistor, such as transistor 821*a*, is formed at the intersection of the DSG 814*a* and a corresponding vertical silicon layer 806*a*. This creates a 'double drain select gate' structure.

Figure 11:
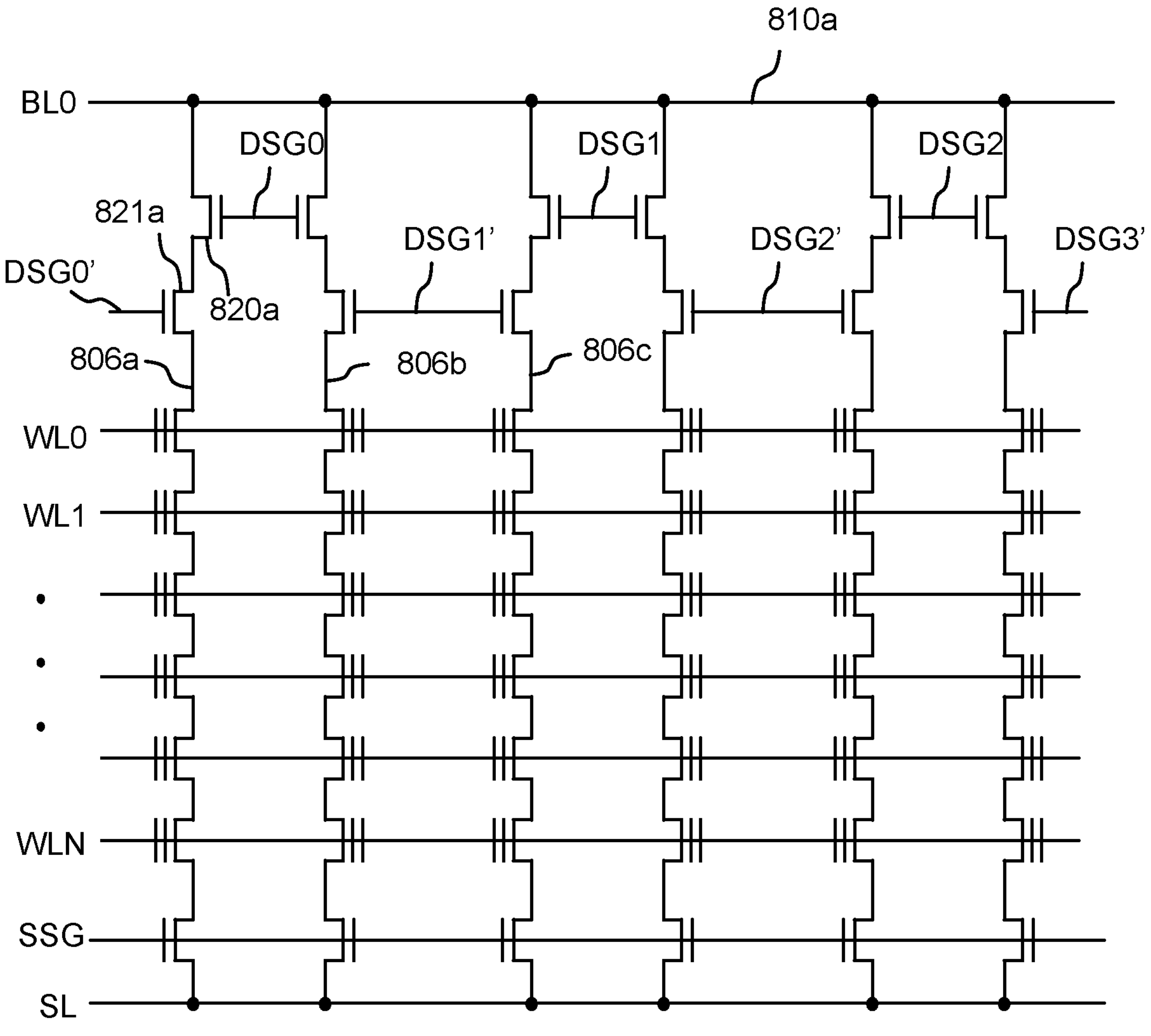
FIG. 11 shows an exemplary equivalent circuit of the array shown in FIG. 10.

FIG. 11 shows an exemplary equivalent circuit of the array shown in FIG. 10.

The equivalent circuit illustrates how the silicon layer (vertical bit line) 806*a* is selected by the drain select gates (820*a* and 821*a*) that receive signals DSG0 and DSG0', the silicon layer (vertical bit line) 806*b* is selected by drain select gate signals DSG0 and DSG1', and the silicon layer (vertical bit line) 806*c* is selected by drain select gate signals DSG1 and DSG1'. Thus, any of the silicon layers (vertical bit lines) 806 can be selected through some combination of the DSG(0-2) and DSG(0'-3') signals.

Figure 12:
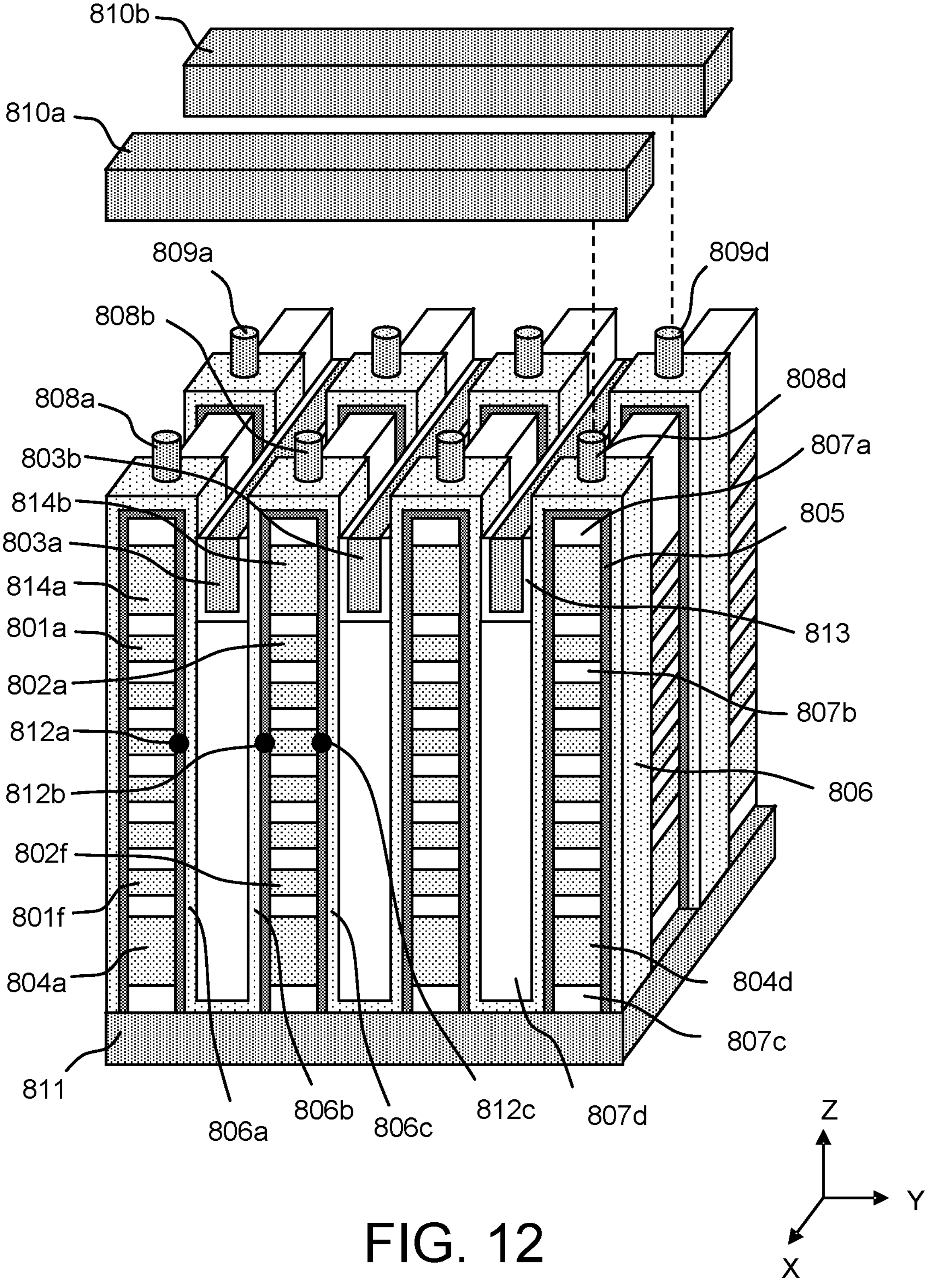
FIG. 12 shows another embodiment of a 3D array constructed in accordance with the invention.

FIG. 12 shows another embodiment of a 3D array constructed in accordance with the invention. This embodiment is similar to the embodiment shown in FIG. 10 except that the second drain select gates 814*a* and 814*b*, etc. are located in parallel (or adjacent) with the drain select gates 803*a* and 803*b*, etc.

Figure 13:
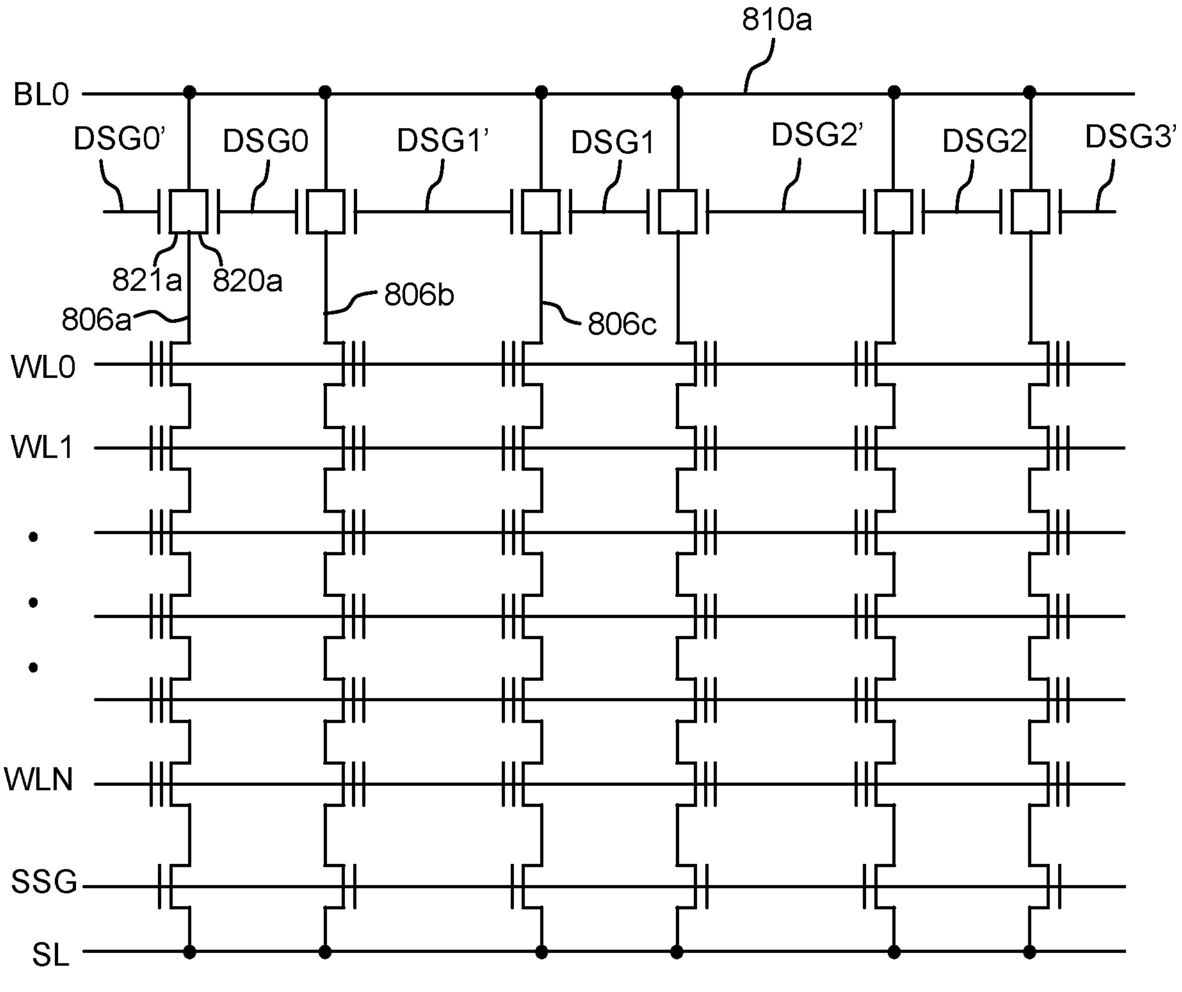
FIG. 13 shows an exemplary embodiment of an equivalent circuit of the array shown in FIG. 12.

FIG. 13 shows an exemplary embodiment of an equivalent circuit of the array shown in FIG. 12 taken along the horizontal bit line 810*a*. In the circuit, the drain select gate signals DSG0-DSG2 and second drain select gate signals DSG0'-DSG3' are connected to pairs of junction-less transistors (e.g., 821*a*/820*a*). When one of the transistor pair is turned off, it will generate a depletion layer under the gate to turn off the channel. Therefore, both the transistors in a pair need to be turned on to turn on the channel. For example, to select vertical bit line 806*a*, both DSG0 and DSG0' will be selected. To select vertical bit line 806*b*, both DSG0 and DSG1' will be selected. To select vertical bit line 806*c*, both DSG1 and DSG1' will be selected. By using this operation, the double-select problem is eliminated since the word lines in the same layer are connected together.

Figure 14:
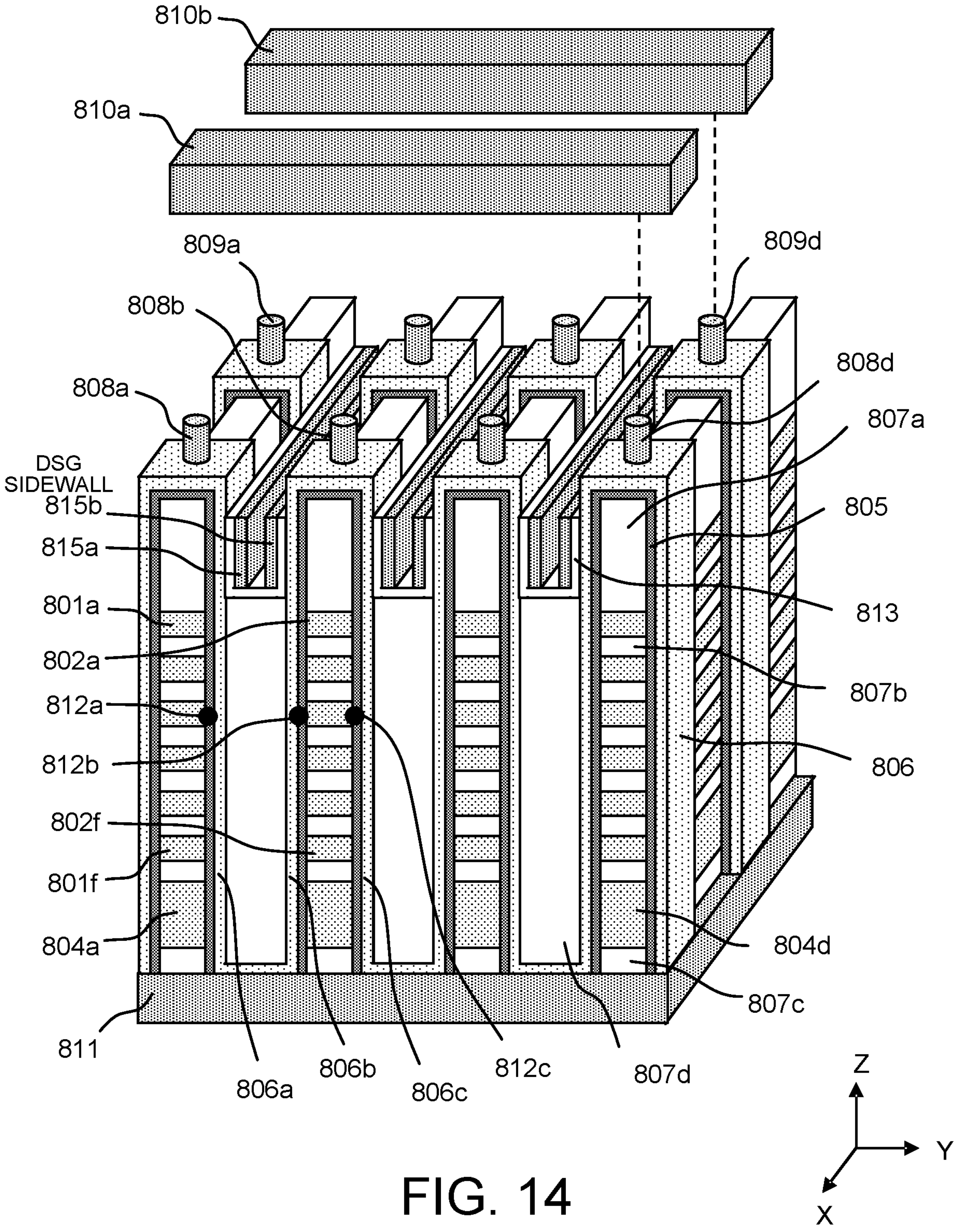
FIG. 14 shows another embodiment of a 3D array constructed in accordance with the invention.

FIG. 14 shows another embodiment of a 3D array constructed in accordance with the invention. This embodiment is similar to the embodiment shown in FIG. 8 except that the drain select gates, such as 815*a* and 815*b*, are formed on the sidewalls of vertical bit lines 806*a* and 806*b* as shown. The drain select gates 815*a* and 815*b* are formed by using a spacer process, or using thin film deposition and then an anisotropic etch process, such as RIE reactive-ion etching to remove the bottom part of the thin film. This allows the drain select gates 815*a* and 815*b* to act independently to select the silicon layers (vertical bit lines) 806*a* and 806*b*, respectively.

Figure 15:
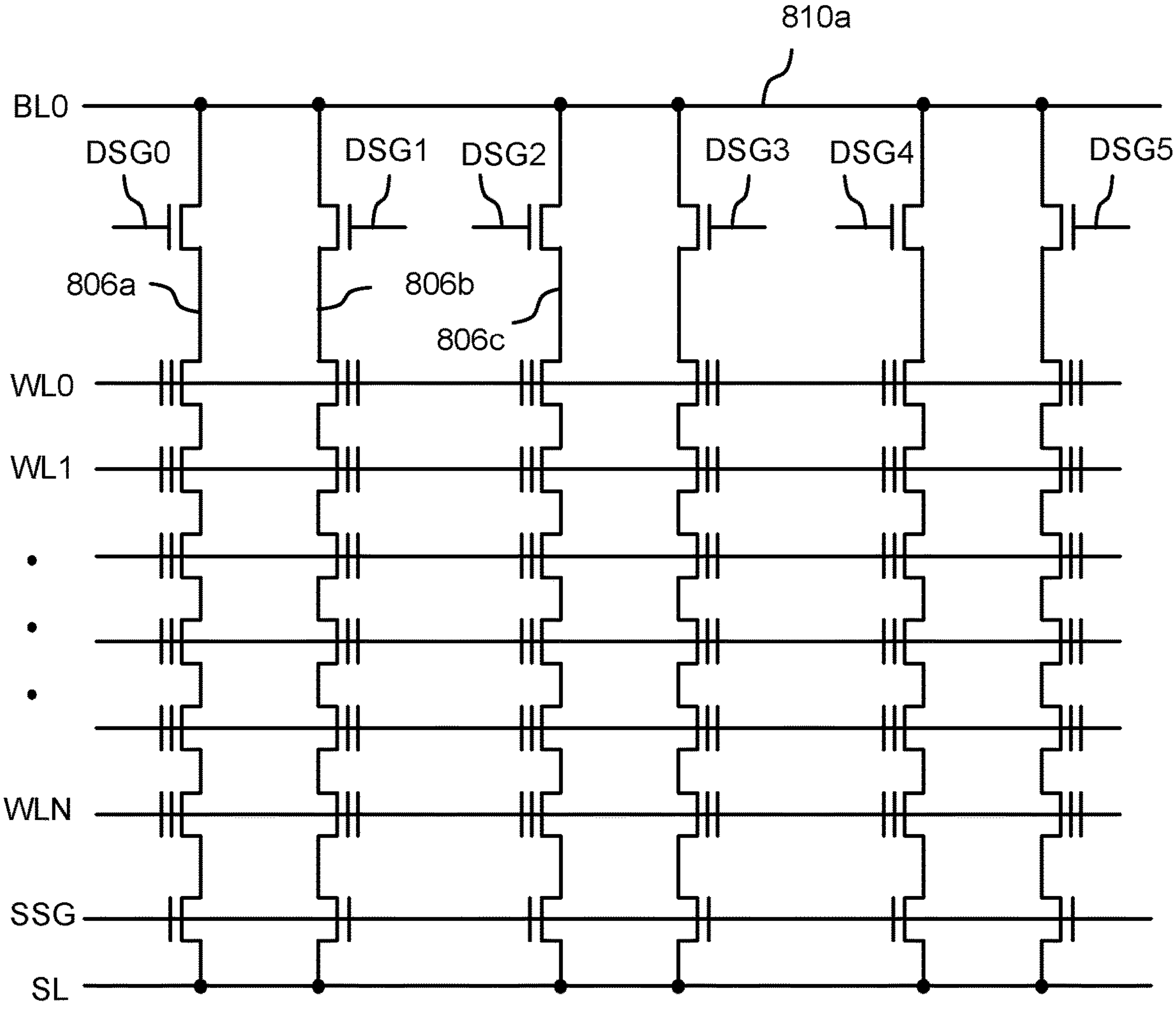
FIG. 15 shows an exemplary embodiment of an equivalent circuit of the array embodiment shown in FIG. 14.

FIG. 15 shows an exemplary embodiment of an equivalent circuit of the array embodiment shown in FIG. 14 taken along the horizontal bit line 110*a*. Because the drain select gates 815*a* and 815*b* are split and formed as sidewalls, the silicon layers (vertical bit lines), such as 806*a-c*, can be selected by the drain select gate signals DSG0-DSG2 independently. Thus, all the word line layers in the even and odd stacks can be connected together to the signals WL(0-N), respectively.

Figure 16:
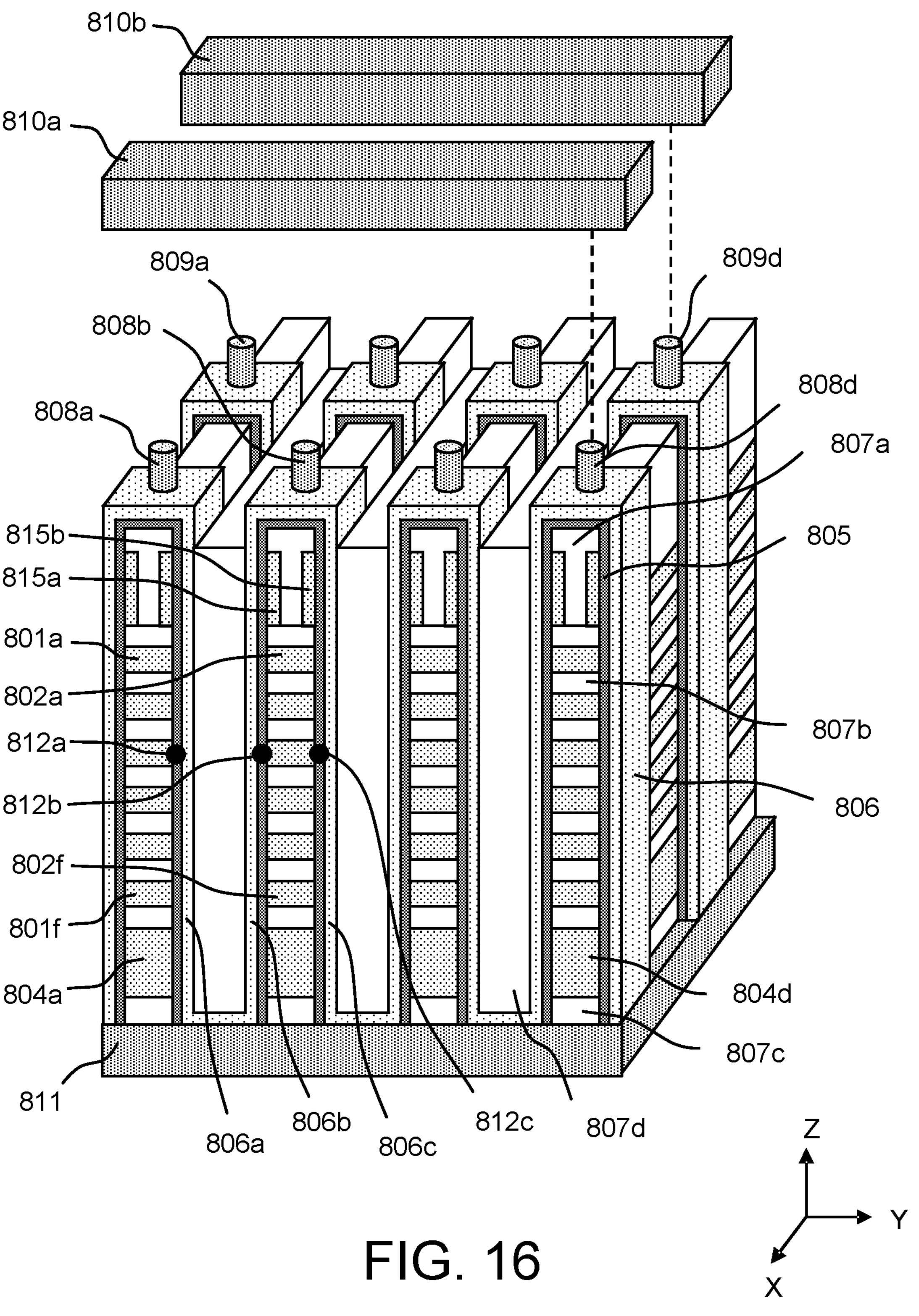
FIG. 16 shows another embodiment of a 3D array constructed in accordance with the invention.

FIG. 16 shows another embodiment of a 3D array constructed in accordance with the invention. This embodiment is similar to the embodiment shown in FIG. 14 except that the drain select gates, such as 815*a* and 815*b*, are formed on the sidewalls of the memory storage layer 805. The drain select gates 815*a* and 815*b* are formed on top of the word lines 802*a-f*. The drain select gates 815*a* and 815*b* are formed by using a spacer process, or using thin film deposition and then an anisotropic etch process, such as RIE reactive-ion etching to remove the bottom part of the thin film. The drain select gates 815*a* and 815*b* independently select the silicon layers (vertical bit lines) 806*b* and 806*c*, respectively. The equivalent circuit of the array embodiment shown in FIG. 16 is the same as the circuit shown in FIG. 15.

As described with reference to FIG. 8, in addition to NAND flash memory, the array structures shown in FIGS. 8-16 can be applied to other types of memory technology, such as resistive random-access memory (RRAM) and phase-change memory (PCM). For these types of applications, because the memory cells are operated like variable resistors between the word lines and bit lines, the array structures may not require the source select gates 804 shown in FIGS. 8-16.

Figure 17:
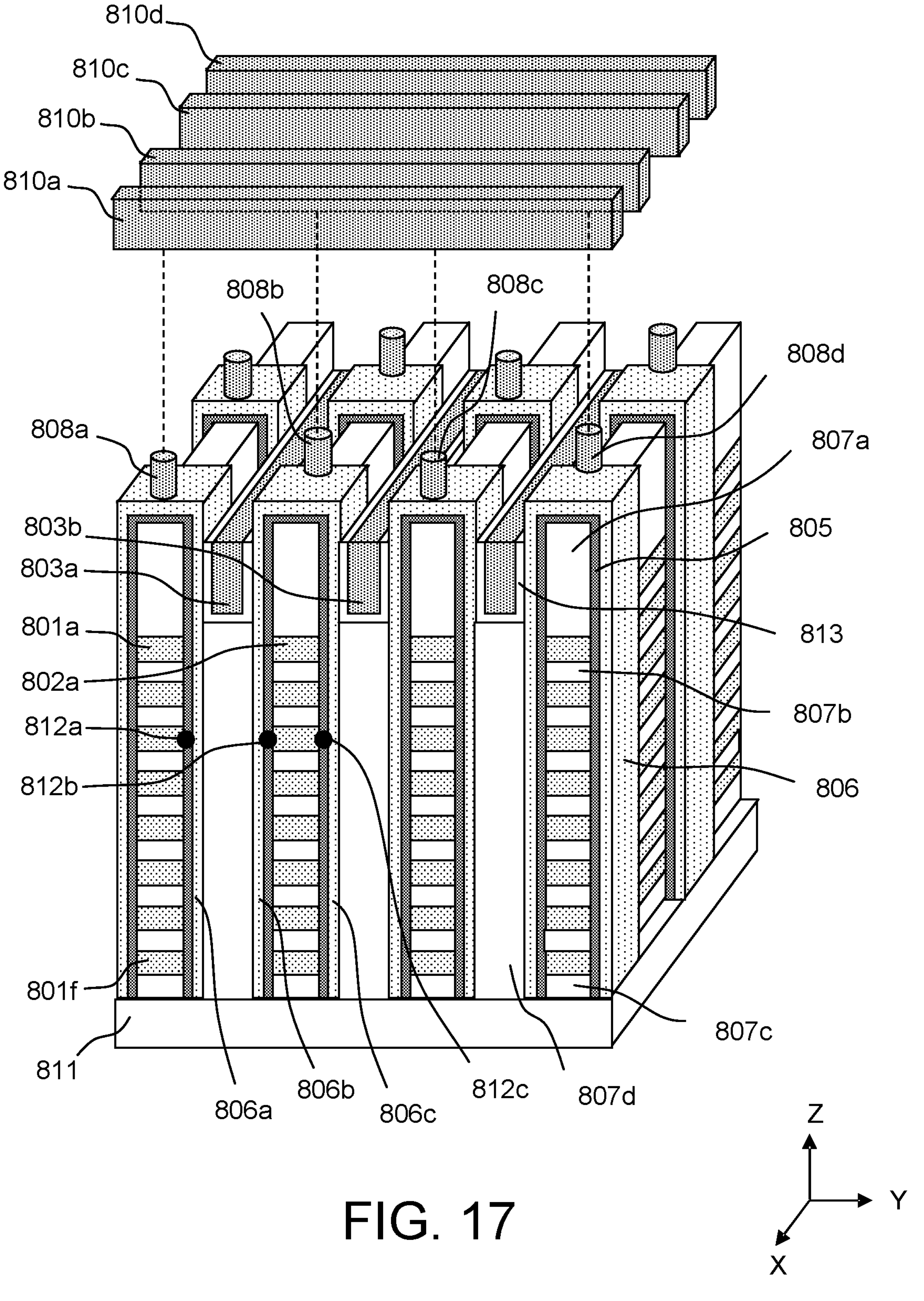
FIG. 17 shows an embodiment a 3D array configured with different memory technology.

FIG. 17 shows an embodiment a 3D array configured with different memory technology. This embodiment is similar to the one shown in FIG. 16 except that the memory layer 805 is formed from materials that implement a resistive random-access memory (RRAM) or a phase-change memory (PCM). In addition, the source select gates 804*a-d* shown in FIG. 16 are removed. The source line layer 811 is also changed to an insulating layer, such as oxide.

Figure 18:
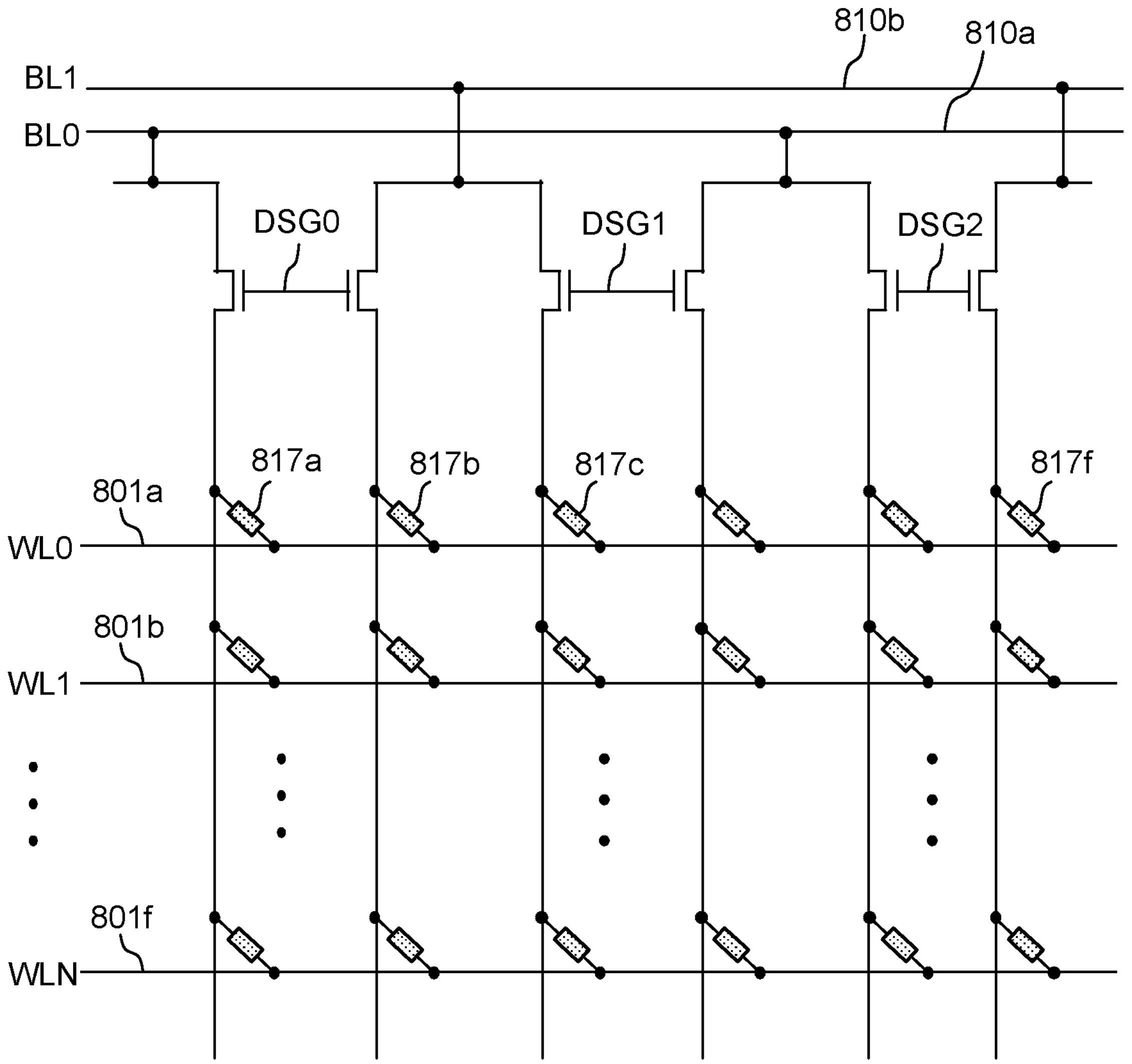
FIG. 18 shows an equivalent circuit of the 3D array shown in FIG. 17.

FIG. 18 shows an equivalent circuit of the memory array shown in FIG. 17. In the circuit shown in FIG. 18, the array comprises resistive type of memory cells 817*a-f*.

Figure 19A:
FIGS. 19A-B show equivalent circuits for two types of resistive memory cells.
Figure 19B:
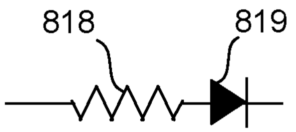

FIGS. 19A-B show equivalent circuits for two types of resistive memory cells.

FIG. 19A shows an embodiment of a first type of memory cell that is suitable for use as the memory cells 817 shown in FIG. 18. The first type of memory cell has only one variable resistor 818, which can be formed from variable resistive material, such as HfOx, TaOx, TiOx, PtOx, WOx, AlOx, CuOx, or other suitable material for RRAM. The memory cell also can be formed from phase-change material, such as chalcogenide for PCM.

FIG. 19B shows an embodiment of a second type of memory cell that is suitable for use as the memory cells 817 shown in FIG. 18. The second type of the memory has one resistor 818 and one "selector," such as a diode 819 or any other material with threshold-behavior to limit the current flowing in one direction.

Figure 20:
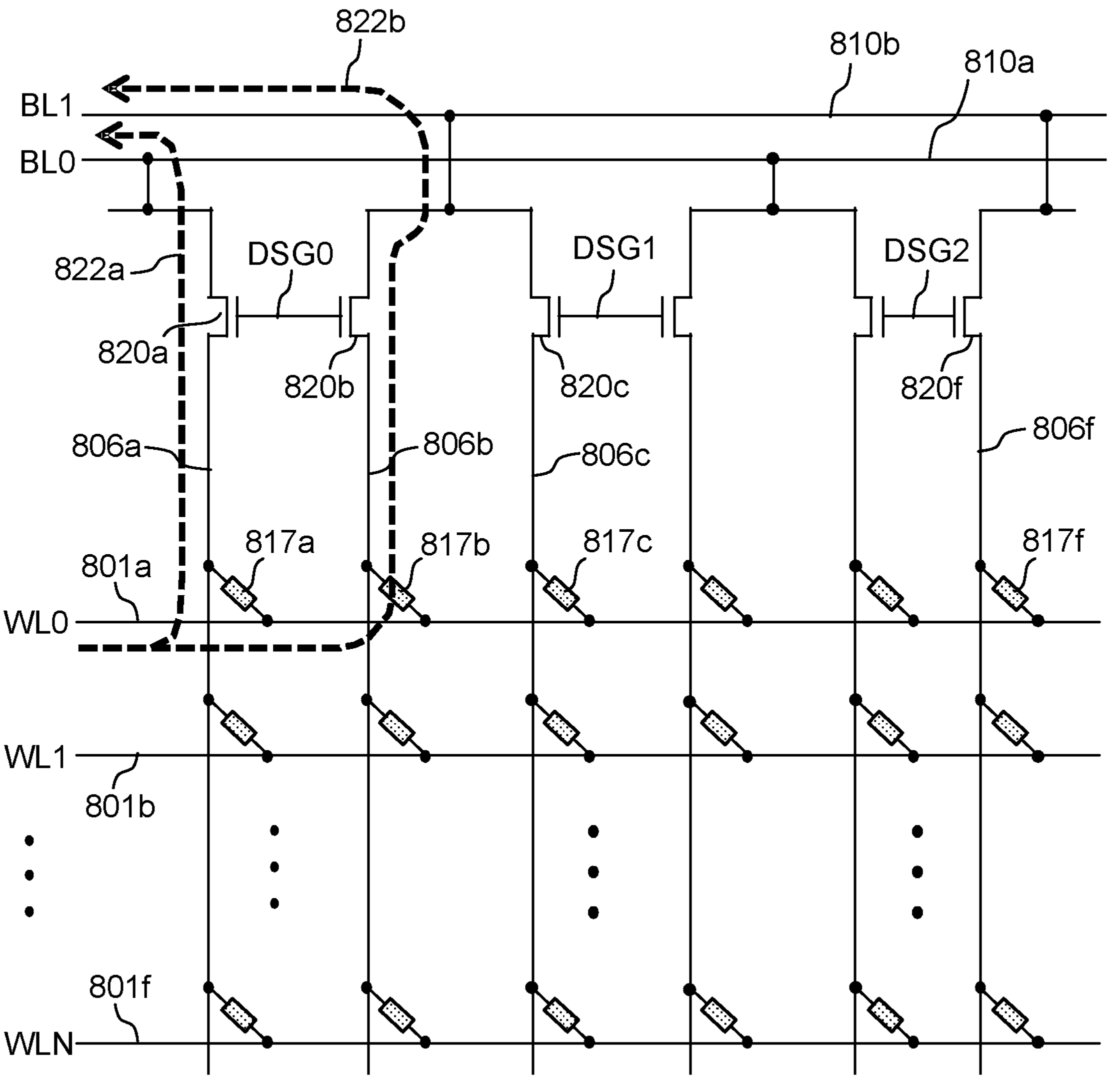
FIG. 20 shows an embodiment illustrating programming and reading conditions for a 3D double-density array having resistive-type of memory cells.

FIG. 20 shows an embodiment illustrating programming and reading conditions for a 3D double-density array having resistive-type memory cells, such as resistive random-access memory (RRAM) and phase-change memory (PCM) shown in FIG. 18. The resistive type of memory cells are programmed by applying a high differential voltage across the cell to cause large current flowing through the cell. For RRAM cells, the resistive memory layer can be formed from metal oxide. The programming conditions cause oxygen ions to migrate and form conductive 'filaments' to reduce the resistance of the cell. For PCM cells, the resistive memory layer can be formed from chalcogenide alloy (Ge2Sb2Te5). The programming conditions cause heat that changes the chalcogenide from the amorphous phase (high-resistive) to the polycrystalline phase (low-resistive).

Referring to FIG. 20, the selected word line WL0 801*a* is supplied with a relative high voltage, such as 3-5V. This causes current flowing through the resistive type of memory cells 817*a* and 817*b* to the vertical bit lines 806*a* and 806*b*, respectively. The selected drain select gate DSG0 is applied with a relative high voltage, such as VDD or 3-5V to turn on the drain select gate transistors 820*a* and 820*b* to connect the vertical bit lines 806*a* and 806*b* to the horizontal bit lines BL0 810*a* and BL1 810*b*, as shown by the dashed lines 822*a* and 822*b*, respectively.

The program voltage is applied to the bit lines BL0 810*a* and BL1 810*b* to program the cells 817*a* and 817*b*, respectively. When the bit line is supplied with a low voltage, such as 0V, it will cause large current to flow through the selected cell, which may program the cell to a low-resistive (programmed) state. When the bit line is floating or supplied with the same voltage as the selected word line WL0 801*a*, it will cause no current to flow through the selected cell, thus the cell will remain at a high-resistive (non-programmed) state.

It should be noted that when applying the high voltage to the selected word line WL0 801*a*, current will also flow through the unselected cells 817*c-f* to the vertical bit lines 806*c-f*. The unselected drain select gates DSG1 and DSG2 are supplied with 0V to turn off the drain select gate transistors 820*c-f*. The current will stop after the vertical bit line capacitance is charged up. Therefore, the unselect cells 820*c-f* will not be programmed.

The unselected word lines WL1 801*b* to WLN 801*f* are supplied with an inhibit voltage such as 0-2V. This voltage is not high enough to cause programming of the cells on the unselected word lines.

The read condition is similar to the program condition except that the voltages are different. During the read operation, the selected word line WL0 801*a* are supplied with a relatively lower voltage than the program operation, such as 1-3V. This low voltage will inhibit the programming of the resistive type of memory cells. The current may flow through the cells 817*a* and 817*b*, and the selected drain select gate transistors 820*a* and 820*b*, to the bit lines BL0 810*a* and BL1 810*b*, respectively. The bit lines are coupled to sensing circuits to sense the bit line current to determine the data of the cells 817*a* and 817*b*.

In another embodiment, the above program condition may be applied in the reverse direction. For example, the selected word line WL0 801*a* is supplied with a low voltage, such as 0V. The selected bit lines BL0 810*a* and BL1 801*b* are supplied with a relatively high voltage, such as 3-5V, to program the cells 817*a* and 817*b*.

Similarly, in another embodiment, the read condition may be applied in the reverse direction. The selected word line WL0 801*a* is supplied with a low voltage, such as 0V. The selected bit lines BL0 810*a* and BL1 801*b* are supplied with a relatively lower voltage compared with the program voltage, such as 1-3V. This causes current to flow from the bit lines 810*a* and 810*b* through the cells 817*a* and 817*b* and to the word line WL0 801*a*. The bit lines are coupled to sensing circuits to sense the bit line current to determine the data of the cells 817*a* and 817*b*.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A three-dimensional (3D) double density array comprising:

a first side of a first channel layer oriented in a vertical direction coupling to a first side of an insulating core and a first side of a second channel layer oriented in the vertical direction coupling to a second side of the insulating core, wherein the insulating core is configured to provide electrical isolation between the first channel layer and the second channel layer;

a first side of a first memory storage layer coupled to a second side of the first channel layer organized in the vertical direction to form a first memory device and a first side of a second memory storage layer coupled to a second side of the second channel layer in the vertical direction to form a second memory device;

a plurality of word lines organized in multiple layers coupled to a string of memory devices containing the first and second memory storage layers, wherein a first word line of the plurality of word lines situated at a first layer is connected to the first memory device and the second memory device; and at least one drain select gate that couples the first and second channels to a bit line.

2. The array of claim 1, wherein the first and second channel layers run in a first direction and the word lines run in a second direction.

3. The array of claim 1, wherein each channel layer includes at least one memory layer.

4. The array of claim 3, wherein at least a portion of the memory layer comprises dielectric material.

5. The array of claim 3, wherein the memory layer comprises charge-trapping layers formed by oxide-nitride-oxide (ONO) material.

6. The array of claim 3, wherein the memory layer comprises resistive random-access memory (RRAM) that includes variable resistive material selected from a set of material comprising HfOx, TaOx, TiOx, PtOx, WOx, AlOx, and CuOx.

7. The array of claim 3, wherein the memory layer comprises phase change memory (PCM) that includes phase-change material comprising chalcogenide.

8. The array of claim 3, wherein the memory layer comprises magneto-resistive random-access memory (MRAM) that comprises magneto-resistive material.

9. The array of claim 3, wherein the memory layer comprises ferroelectric random-access memory (FRAM) that comprises ferroelectric material.

10. The array of claim 3, wherein the memory layer comprises anti-fuse one-time-programmable (OTP) memory that comprises a dielectric layer.

11. The array of claim 1, wherein the first and second channel layers are separated by the insulating core.

12. The array of claim 1, wherein each of channel layer is coupled to a source select gate that couples the channel layer to a source line.

13. The array of claim 1, wherein the array comprises a plurality of strings that are separated by insulator pillars.

14. The array of claim 1, wherein each of the first and second channel layers is coupled to a contact by a selected drain select gate, and wherein the contact is connected to the bit line.

15. The array of claim 1, further comprising a plurality of contacts coupled to a plurality of strings aligned in one of an alternating alignment or a staggered alignment, and wherein linear bit lines are connected to the plurality of contacts.

16. A three-dimensional (3D) double density array comprising:

a channel layer oriented in a vertical direction across multiple layers and configured to couple to an insulating core;

a string of memory devices, coupled to the channel layer and structured in a 3D configuration with multiple layers in the vertical direction, configured to allocate a first portion of memory devices and a second portion of memory devices, wherein the first portion forms a first channel and the second portion forms a second channel separated by the insulating core providing electrical isolation;

a first word line of a plurality of word lines situated at a first layer of the multiple layers coupled to the string of memory devices and configured to connect to a first memory device of the first portion of memory devices situated at the first layer that forms the first channel and a first memory device of the second portion of memory devices situated at the first layer that forms the second channel;

an insulator pillar coupled to the channel layer and configured to bisect the insulating core wherein a first side of the insulator pillar contacts a side of the first channel and a second side of the insulator pillar contacts a side of the second channel providing electrical insulation between the first channel and the second channel; and a drain select gate coupled to the first and second channels for providing volage control.

17. The array of claim 16, wherein the first and second channels run in a first direction and the word lines run in a second direction.

18. The array of claim 16, wherein each channel includes a memory storage layer.

19. The array of claim 18, wherein at least a portion of the memory layer comprises dielectric material.

20. The array of claim 18, wherein the memory layer comprises charge-trapping layers formed by oxide-nitride-oxide (ONO) material.

21. A three-dimensional multi-density memory structure comprising:

a plurality of word line layers separated by a plurality of insulating layers organized in a vertical direction;

a plurality of vertical strings disposed through the plurality of word line layers organized in the vertical direction, wherein each of the vertical string includes a first and a second memory storage layer organized in the vertical direction separated by an insulating core, wherein the first memory storage layer stores a first data and the second memory storage layer stores a second data accessible by connected word lines; and a plurality of insulator pillars coupled to the plurality of vertical strings and each of the insulator pillars configured to bisect at least one insulating core in one of the plurality of vertical strings, wherein at least one of the plurality of the insulator pillars is configured to provide electrical isolation between the first memory storage layer and the second memory storage layer, wherein a first side of the at least one insulator pillar contacts a side of the first memory storage layer and a second side of at least one insulator pillar contacts a side of the second memory storage layer.

* * * * *